(12) United States Patent
Chen et al.

(10) Patent No.: US 9,633,961 B2
(45) Date of Patent: Apr. 25, 2017

(54) PACKAGING DEVICES AND METHODS OF MANUFACTURE THEREOF

(71) Applicant: Taiwan Semiconductor Manufacturing Company, Ltd., Hsin-Chu (TW)

(72) Inventors: Hsien-Wei Chen, Hsin-Chu (TW); Jie Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/237,399

(22) Filed: Aug. 15, 2016

(65) Prior Publication Data
US 2016/0351518 A1 Dec. 1, 2016

Related U.S. Application Data

(63) Continuation of application No. 14/632,896, filed on Feb. 26, 2015, now Pat. No. 9,418,952, which is a
(Continued)

(51) Int. Cl.
*H01L 21/00* (2006.01)
*H01L 23/00* (2006.01)
(Continued)

(52) U.S. Cl.
CPC ............ *H01L 24/06* (2013.01); *H01L 21/56* (2013.01); *H01L 23/3171* (2013.01); *H01L 23/49838* (2013.01); *H01L 23/5389* (2013.01); *H01L 23/562* (2013.01); *H01L 24/02* (2013.01); *H01L 24/03* (2013.01); *H01L 24/05* (2013.01); *H01L 24/19* (2013.01); *H01L 24/20* (2013.01); *H01L 24/11* (2013.01); *H01L 24/13* (2013.01); *H01L 2224/0214* (2013.01);
(Continued)

(58) Field of Classification Search
CPC ........................................................ H01L 24/06
See application file for complete search history.

(56) References Cited

U.S. PATENT DOCUMENTS 6,392,163 B1 5/2002 Rinne et al.
6,777,815 B2 8/2004 Huang
(Continued)

FOREIGN PATENT DOCUMENTS

GB         2464549 A      4/2010
JP       2012023065        2/2012
(Continued)

*Primary Examiner* — William Harriston
(74) *Attorney, Agent, or Firm* — Slater Matsil, LLP

(57) ABSTRACT

Packaging devices and methods of manufacture thereof for semiconductor devices are disclosed. In some embodiments, a packaging device includes a contact pad disposed over a substrate, and a passivation layer disposed over the substrate and a first portion of the contact pad. A post passivation interconnect (PPI) line is disposed over the passivation layer and is coupled to a second portion of the contact pad. A PPI pad is disposed over the passivation layer. A transition element is disposed over the passivation layer and is coupled between the PPI line and the PPI pad. The transition element comprises a first side and a second side coupled to the first side. The first side and the second side of the transition element are non-tangential to the PPI pad.

20 Claims, 13 Drawing Sheets

FIG. 14

Related U.S. Application Data continuation-in-part of application No. 13/894,107, filed on May 14, 2013, now Pat. No. 9,355,978.

(60) Provisional application No. 61/776,681, filed on Mar. 11, 2013.

(51) Int. Cl.
*H01L 23/498* (2006.01)
*H01L 23/538* (2006.01)
*H01L 21/56* (2006.01)
*H01L 23/31* (2006.01)

(52) U.S. Cl.
CPC .............. *H01L 2224/0235* (2013.01); *H01L 2224/0239* (2013.01); *H01L 2224/02311* (2013.01); *H01L 2224/02313* (2013.01); *H01L 2224/02331* (2013.01); *H01L 2224/0401* (2013.01); *H01L 2224/04105* (2013.01); *H01L 2224/05124* (2013.01); *H01L 2224/05147* (2013.01); *H01L 2224/05155* (2013.01); *H01L 2224/05166* (2013.01); *H01L 2224/05171* (2013.01); *H01L 2224/05548* (2013.01); *H01L 2224/05551* (2013.01); *H01L 2224/05552* (2013.01); *H01L 2224/05567* (2013.01); *H01L 2224/05624* (2013.01); *H01L 2224/05647* (2013.01); *H01L 2224/05655* (2013.01); *H01L 2224/05666* (2013.01); *H01L 2224/05671* (2013.01); *H01L 2224/06131* (2013.01); *H01L 2224/06136* (2013.01); *H01L 2224/06179* (2013.01); *H01L 2224/11013* (2013.01); *H01L 2224/11334* (2013.01); *H01L 2224/11849* (2013.01); *H01L 2224/12105* (2013.01); *H01L 2224/131* (2013.01); *H01L 2224/13024* (2013.01); *H01L 2224/13109* (2013.01); *H01L 2224/13111* (2013.01); *H01L 2224/13116* (2013.01); *H01L 2224/211* (2013.01); *H01L 2224/215* (2013.01); *H01L 2224/221* (2013.01); *H01L 2924/01322* (2013.01); *H01L 2924/181* (2013.01); *H01L 2924/3512* (2013.01)

(56) References Cited

U.S. PATENT DOCUMENTS

| | | |
|---|---|---|
| 8,735,273 B2 | 5/2014 | Lu et al. |
| 2004/0053483 A1 | 3/2004 | Nair et al. |
| 2006/0138675 A1 | 6/2006 | Rinne |
| 2007/0284726 A1 | 12/2007 | Lin et al. |
| 2008/0128905 A1 | 6/2008 | Lee et al. |
| 2009/0079094 A1 | 3/2009 | Lin |
| 2011/0198753 A1 | 8/2011 | Holland |
| 2011/0272819 A1 | 11/2011 | Park et al. |
| 2013/0043583 A1 | 2/2013 | Wu et al. |
| 2014/0252601 A1 | 9/2014 | Lu et al. |
| 2014/0252610 A1 | 9/2014 | Chen et al. |
| 2014/0262468 A1 | 9/2014 | Chen et al. |
| 2014/0264846 A1 | 9/2014 | Chen et al. |
| 2014/0264884 A1 | 9/2014 | Chen et al. |
| 2015/0091191 A1 | 4/2015 | Chen et al. |

FOREIGN PATENT DOCUMENTS

| | | |
|---|---|---|
| KR | 20090031293 A | 3/2009 |
| KR | 1020110123526 A | 11/2011 |
| KR | 1020130020512 A | 2/2013 |
| TW | 479344 B | 3/2002 |
| TW | 498530 B | 8/2002 |
| TW | 200527625 A | 8/2005 |
| TW | I249822 B | 2/2006 |

PACKAGING DEVICES AND METHODS OF MANUFACTURE THEREOF

PRIORITY CLAIM AND CROSS-REFERENCE

This application is a continuation of U.S. patent application Ser. No. 14/632,896, filed Feb. 26, 2015, and entitled "Packaging Devices and Methods of Manufacture Thereof," which application is a continuation-in-part of, and claims the benefit of, U.S. patent application Ser. No. 13/894,107 filed on May 14, 2013 and entitled, "Packaging Devices and Methods of Manufacture Thereof," which claims the benefit of U.S. Provisional Application No. 61/776,681 filed on Mar. 11, 2013 and entitled "Packaging Devices and Methods of Manufacture Thereof,", which patent applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts may be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
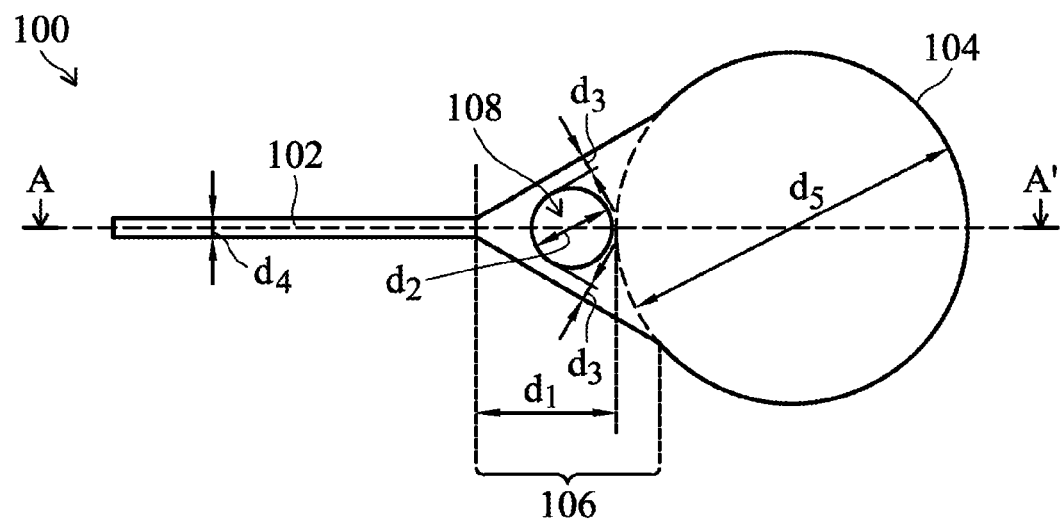
FIG. 1 is a top view of a portion of a packaging device illustrating some embodiments of the present disclosure that include a transition element having a circular hollow region disposed between a PPI line and a PPI pad.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to packaging devices and methods of manufacture thereof for semiconductor devices. Packaging devices will be described herein that include a transition element disposed between a post-passivation interconnect (PPI) line and a PPI pad that provides an area for a wetting region to form when a conductive material is coupled to the PPI pad or when the conductive material is re-flowed in a later packaging or manufacturing process, which improves reliability and prevents cracking of the conductive material joint.

Figure 3:
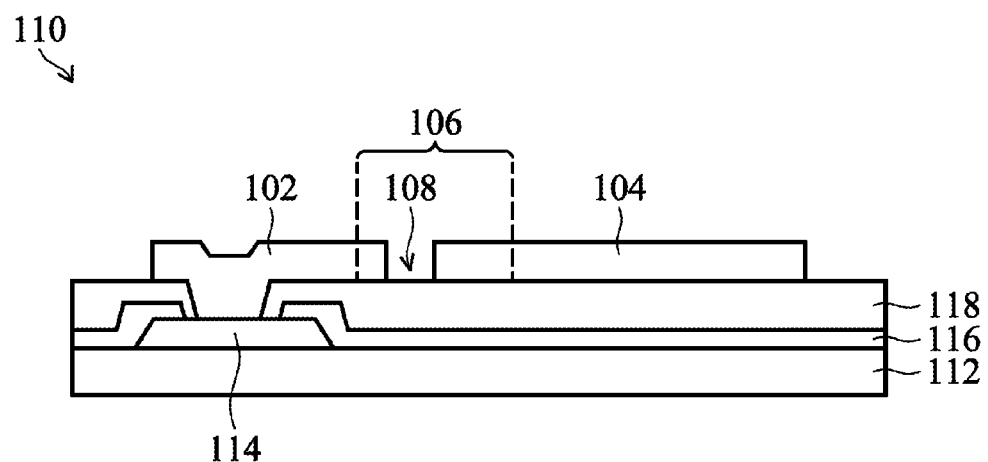
FIGS. 3 and 4 are cross-sectional views of a packaging device in accordance with some embodiments at various stages of manufacturing.

Referring first to FIG. 1, a top view of a portion 100 of a packaging device (e.g., a portion 100 of a packaging device 110 shown in FIGS. 3 and 4) in accordance with some embodiments of the present disclosure is illustrated. A cross-sectional view of the packaging device 110 at view A-A' is shown in FIG. 3. The packaging device 110 includes a transition element 106 having a hollow region 108 disposed between a PPI line 102 and a PPI pad 104. The PPI line 102, PPI pad 104, and transition element 106 comprise a conductive material and are integral to one another in some embodiments. Only one PPI line 102, PPI pad 104, and transition element 106 are shown in the drawings; however, a plurality of PPI lines 102, PPI pads 104, and transition elements 106 are formed across a surface of the packaging device 110 and are used for making electrical connections to a plurality of contact pads 114 disposed over a substrate 112. PPI line 102, PPI pad 104, and transition element 106 comprise a redistribution layer (RDL) or other interconnect routing structures of the packaging device 110 in some embodiments, for example.

The PPI line 102 is a conductive line that extends over an underlying contact pad 114 (see FIG. 3). The PPI line 102 fills an opening in a polymer layer 118 and a passivation layer 116 and forms an electrical connection with the contact pad 114. The PPI line 102 contacts the transition element 106, and the transition element 106 contacts the PPI pad 104. The PPI line 102 may have a narrow, wide, or tapered shape. The PPI line 102 may comprise a substantially constant thickness and width. The PPI line 102 terminates at the transition element 106, and the transition element 106 terminates at the PPI pad 104; therefore, the bodies of the PPI line 102, transition element 106, and the PPI pad 104 may be formed as one piece.

The transition element 106 advantageously prevents solder or other eutectic material of a conductive material (not shown in FIG. 1; see conductive material 120 shown in FIG. 4) from forming on the PPI line 102, to be described further herein. The transition element 106 has a single hollow region 108 in the embodiments shown in FIG. 1. The hollow region 108 comprises a cave within the otherwise solid transition element 106, for example. In other embodiments, the transition element 106 comprises a plurality of hollow regions 108, which will also be described further herein.

The distance between the PPI line 102 and PPI pad 104 comprises dimension $d_1$ that comprises about 150 μm or less in some embodiments. In some embodiments, dimension $d_1$ comprises about 20 μm to about 150 μm. Dimension $d_1$ may also comprise other values. For example, in other embodiments, dimension $d_1$ is greater than 150 μm. The width of the transition element 106 is slightly greater than dimension $d_1$ due to the curved shape of the PPI pad 104 in some embodiments.

Figure 2:
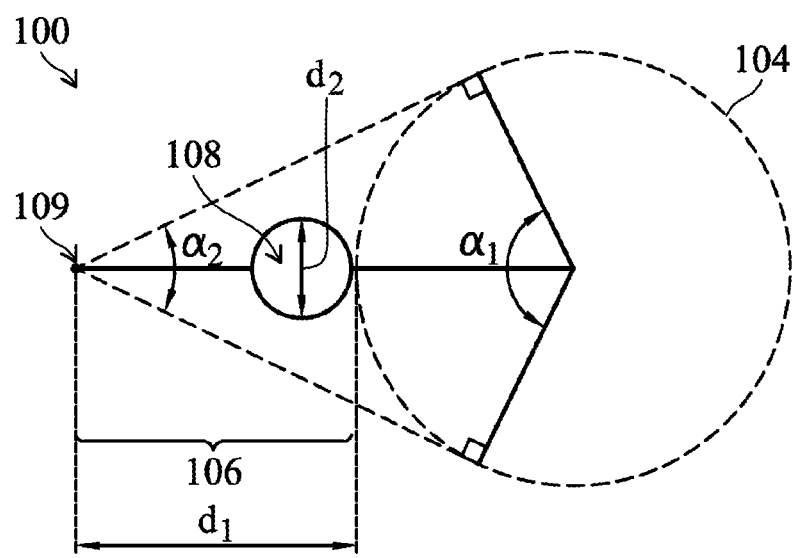
FIG. 2 illustrates several angles and dimensions of the transition element relative to the PPI pad in accordance with some embodiments.

The transition element 106 is a triangular connection comprising a shape of a triangle having a curved side proximate the PPI pad 104 in the embodiment shown in FIG. 1. The transition element 106 may also comprise other shapes, to be described further herein. The hollow region 108 is positioned within a central region of the transition element 106 in some embodiments, as shown. The hollow region 108 may also be offset from the central region of the transition element 106. The hollow region 108 is spaced apart from an edge of the PPI pad 104 in some embodiments, as illustrated in FIG. 1. The hollow region 108 may be spaced apart from the edge of the PPI pad 104 by a few μm, for example. The hollow region 108 may also be spaced apart from the PPI pad 104 by other amounts, or the hollow region 108 may directly contact the edge of the PPI pad 104, as shown in FIG. 2.

Referring again to FIG. 1, the hollow region 108 of the transition element 106 comprises a shape of a circle in the embodiment shown; however, the shape of the hollow region 108 may also comprise an oval, triangle, rectangle, square, or polygon, as examples. The hollow region 108 may also comprise other shapes. The hollow region 108 comprises a width comprising dimension $d_2$ of about 100 μm or less in some embodiments. In some embodiments, dimension $d_2$ comprises about 55 μm. Dimension $d_2$ may also comprise other values.

The transition element 106 comprises a minimum width proximate the hollow region 108 comprising dimension $d_3$, wherein dimension $d_3$ comprises about 15 μm or less in some embodiments, for example. Dimension $d_3$ comprises a width of a portion of the transition element 106 in some embodiments. The PPI line 102 comprises a width comprising dimension $d_4$, wherein dimension $d_4$ comprises about 15 μm in some embodiments, for example. In some embodiments, dimension $d_4$ comprises about 10 μm to about 100 μm, for example. Dimension $d_4$ may also be greater than or less than 15 μm in some embodiments. Dimension $d_3$ may be greater than about 15 μm in embodiments wherein dimension $d_4$ is greater than about 15 μm, for example. Dimension $d_3$ is equal to or less than dimension $d_4$ in some embodiments of the present disclosure, for example. Dimensions $d_3$ and $d_4$ may also comprise other values and other relative values. Dimension $d_4$ is also referred to herein as a first width and dimension $d_3$ is also referred to herein as a second width (e.g., in some of the claims), wherein the second width is less than or equal to the first width, for example. Dimension $d_3$ being equal to or less than dimension $d_4$ advantageously ensures that a eutectic material of a conductive material 120 cannot re-flow or wet excessively and reach the PPI line 102 in some embodiments, for example.

The PPI pad 104 comprises a shape of a circle in the embodiment shown. In other embodiments, the PPI pad 104 may comprise the shape of an oval, square, rectangle, or other shapes. The PPI pad 104 comprises a width (which width comprises a diameter in embodiments wherein the PPI pad 104 comprises a circular shape) comprising dimension $d_5$. Dimension $d_5$ comprises about 200 μm in some embodiments, for example. Dimension $d_5$ may also be greater or less than 200 μm depending on the design rule for packaging device, for example. Dimension $d_5$ comprises about 180 μm to about 260 μm in other embodiments. In some embodiments, dimension $d_2$ of the hollow region 108 is about 1/10 to about 1/3 than dimension $d_5$ of the PPI pad 104. Dimension $d_5$ is also referred to herein as a first width and dimension $d_2$ is also referred to herein as a second width (e.g., in some of the claims), wherein the second width is about 1/10 to about 1/3 of the first width. In some embodiments, dimension $d_2$ is about 1/4 of dimension $d_5$, for example. In embodiments wherein dimension $d_5$ is 200 μm, dimension $d_2$ may comprise about 45 to 55 μm, as an example. In embodiments wherein the transition element 106 comprises a plurality of hollow regions 108, a total width of the hollow regions 108 may comprise about 1/3 or less of dimension $d_5$, as another example.

FIG. 2 illustrates several angles and dimensions of the transition element 106 shown in FIG. 1 relative to the PPI pad 104 in accordance with some embodiments. An angle $\alpha_1$ between edges where the transition element 106 contacts the PPI pad 104 comprises about 130 degrees in some embodiments, and an angle $\alpha_2$ at a point 109 where the transition element 106 contacts the PPI line 102 comprises about 50 degrees in some embodiments, as an example. Angle $\alpha_2$ is less than about 90 degrees in accordance with some embodiments. In some embodiments, the transition element is substantially triangle-shaped and comprises two sides coupled together that form a corner at point 109, wherein the angle $\alpha_2$ between the two sides at the corner 109 is less than about 90 degrees, for example.

Figure 4:
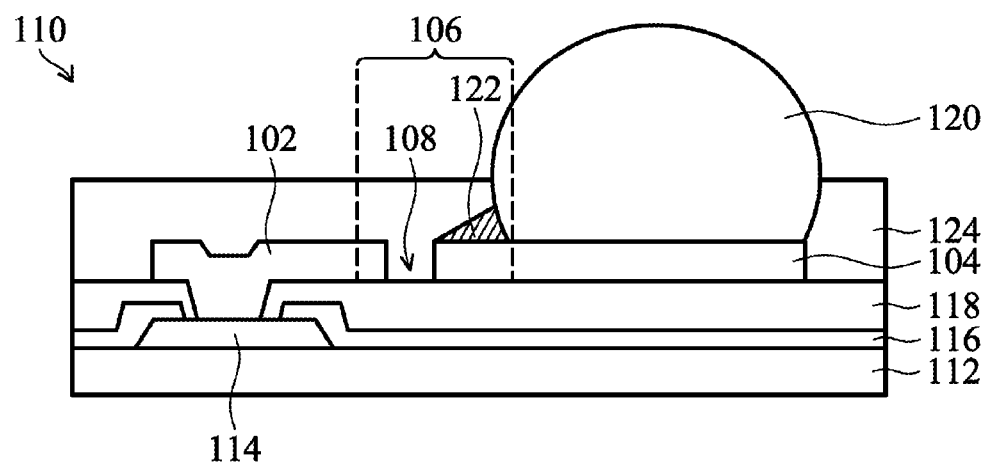

FIGS. 3 and 4 are cross-sectional views of a packaging device 110 in accordance with some embodiments at various stages of manufacturing. To manufacture the packaging device 110, first, a substrate 112 is provided. The substrate 112 may comprise silicon, other types of bulk semiconductor material, or other materials, as examples. The substrate 112 may include one or more ICs formed thereon, not shown. The IC(s) may contain active and passive devices, conductive layers, and dielectric layers according to the electrical design of the IC(s), as examples.

A conductive layer is formed as a contact pad 114 using a patterning and deposition process over the substrate 112. The contact pad 114 may comprise aluminum (Al), copper (Cu), tin (Sn), nickel (Ni), gold (Au), silver (Ag), other electrically conductive materials, or multiple layers or combinations thereof, as examples. The contact pad 114 may be formed using an electrolytic plating or electro-less plating process, for example. The size, shape, and location of the contact pad 114 are only for illustration purposes. A plurality of the contact pads 114 (not shown) are formed over the surface of the substrate 112, and the contact pads 114 may be of the same size or of different sizes.

A passivation layer 116 may be formed over the surface of the substrate 112 and over the top surface of the contact pad 114 for structural support and physical isolation. The passivation layer 116 comprises silicon nitride (SiN), silicon dioxide ($SiO_2$), silicon oxynitride (SiON), polyimide (PI), benzocyclobutene (BCB), polybenzoxazole (PBO), other insulating materials, or combinations or multiple layers thereof, as examples. An opening in the passivation layer 116 may be made by removing a portion of passivation layer 116 using a mask-defined photoresist etching process to expose a portion of the contact pad 114, while leaving another portion of the contact pad 114 covered.

A polymer layer 118 may be formed on the passivation layer 116, following the contour of the passivation layer 116 and filling a part of the opening of the passivation layer 116 over the contact pad 114. The polymer layer 118 may not completely fill the opening of the passivation layer 116 over the contact pad 114; rather, it may be patterned to form an opening to expose a portion of the contact pad 114, while covering other portions of the contact pad 114. The patterning of the polymer layer 118 may include photolithography techniques. The polymer layer 118 may be formed of a polymer, such as an epoxy, polyimide, BCB, PBO, and the like, although other relatively soft, often organic, dielectric materials may also be used. Spin coating or other commonly used formation methods may be used to apply the polymer layer 118. The thickness of the polymer layer 118 may be between about 5 μm and about 30 μm, for example. The polymer layer 118 may also comprise other dimensions.

A conductive material such as a metal is used to form the PPI line 102, PPI pad 104, and transition element 106 over the polymer layer 118, following the contour of the polymer layer 118. The PPI line 102, PPI pad 104, and transition element 106 may have a thickness of less than about 30 μm, and may comprise a thickness of about 2 μm to about 10 μm in some embodiments, as examples. The PPI line 102, PPI pad 104, and transition element 106 may comprise a metal such as Ti, Al, Ni, nickel vanadium (NiV), Cu, or combinations or multiple layers thereof, as examples. The PPI line 102, PPI pad 104, and transition element 106 may be formed using electrolytic plating, electro-less plating, sputtering, chemical vapor deposition methods, and/or photolithography processes, for example. The PPI line 102, PPI pad 104, and transition element 106 may comprise a single layer or multiple layers using an adhesion layer of Ti, TiW, Cr, or other materials, for example. The PPI line 102, PPI pad 104, and transition element 106 may also comprise other materials and dimensions, and may be formed using other methods. The substrate 112 is connected to a number of PPI lines 102, PPI pads 104, and transition elements 106 which may electrically connect to the contact pads 114 of the substrate 112, for example.

In some embodiments, a blanket coating of conductive material may be formed over the polymer layer 118 and the exposed portion of the contact pad 114, and the conductive material is patterned using lithography, e.g., by forming a layer of photoresist (not shown) over the conductive material, patterning the photoresist, and using the photoresist as an etch mask during an etch process for the conductive material, forming the conductive material into the desired patterns and shapes of the PPI lines 102, PPI pads 104, and transition elements 106. The layer of photoresist is then removed. In other embodiments, a seed layer (also not shown) is formed over the polymer layer 118 and exposed portion of the contact pad 114, and a layer of photoresist is formed over the seed layer. The photoresist is patterned with the desired patterns and shapes of the PPI lines 102, PPI pads 104, and transition elements 106. The conductive material is then plated onto the seed layer through the patterns in the photoresist. The photoresist is removed, and the seed layer is removed from over the polymer layer 118. Other methods may also be used to form the PPI lines 102, PPI pads 104, and transition elements 106. In some embodiments, the PPI lines 102, PPI pads 104, and transition elements 106 are simultaneously formed in a single step.

A solder flux (not shown) may be applied to the PPI line 102, PPI pad 104, and transition element 106 in some embodiments to assist in the flow of the solder, such that a subsequently formed conductive material 120 shown in FIG.

4 makes good physical and electrical contact with the PPI pad 104. The flux may be applied by brushing, spraying, a stencil, or other methods, as examples. The flux generally has an acidic component that removes oxide barriers from the solder surfaces, and an adhesive quality that helps to prevent an integrated circuit from moving on the substrate surface during the packaging process.

Referring next to FIG. 4, a conductive material 120 is formed over the PPI pad 104. The PPI pad 104 is used to connect to the conductive material 120, forming a connection between the contact pad 114 to the conductive material 120 by way of the PPI line 102, the transition element 106, and the PPI pad 104. The conductive material 120 may have a larger diameter or diameter than the diameter or width comprising dimension $d_5$ of the PPI pad 104.

The conductive material 120 comprises a eutectic material and may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials 120 such as solder balls may be formed from SnCu compounds as well, without the use of silver (Ag). Lead-free solder connectors may also include tin and silver, Sn—Ag, without the use of copper. The conductive material 120 may be one among an array of the conductive materials 120 formed as a grid, referred to as a "ball grid array" or "BGA". The conductive materials 120 may also be arranged in other shapes. The conductive material 120 comprises a conductive ball having a shape of a partial sphere in some embodiments. The conductive material 120 may also comprise other shapes. The conductive material 120 may also comprise non-spherical conductive connectors, for example.

The conductive material 120 is attached in some embodiments using a solder ball drop process. During the conductive material 120 mounting process, or after the conductive material mounting process, the eutectic material of the conductive material 120 may be re-flowed, and a portion of the conductive material 120 flows over a portion of the transition element 106 in some embodiments, forming a wetting region 122. In some embodiments, the wetting region 122 is formed over the entire transition element 106, not shown. In other embodiments, the wetting region 122 is not formed. Advantageously, the inclusion of the transition element 106, the hollow region 108 of the transition element 106, and the dimensions and shape of the hollow region 108 and transition element 106 result in preventing or reducing an amount of wetting region formation over the PPI line 102. In some embodiments, the wetting region 122 is not formed on the PPI line 102, for example.

A molding compound 124 is then formed over the PPI line 102, PPI pad 104, and transition element 106 and exposed portions of the polymer layer 118 in some embodiments, also shown in FIG. 4. A top portion of the molding compound 124 may be recessed so that a top portion of the conductive material 120 is exposed. An amount of the molding compound 124 applied may also be controlled so that the top portion of the conductive material 120 is exposed. A molding compound clamp may be applied during a curing process and a plasma treatment process of the molding compound 124 in some embodiments, for example.

In some embodiments, the transition element 106 comprises a plurality of hollow regions 108, as shown in FIGS. 5, 6, 7, 9, 10, and 11 in a top view. The hollow regions 108 may comprise the shape of a circle, an oval, a triangle, a triangle with a curved side or a curved corner, a rectangle, a rectangle with a curved side or a curved corner, a square, a square with a curved side or a curved corner, a polygon, a polygon with a curved side or a curved corner, a fragment of an annulus, other shapes, or combinations thereof, as examples.

Figure 5:
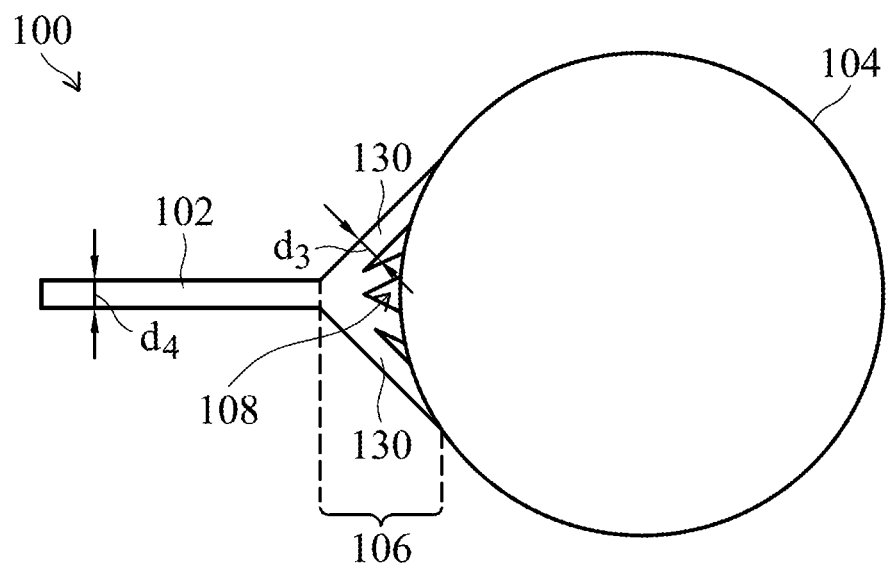
FIGS. 5 through 7 are top views of a portion of a packaging device in accordance with other embodiments, wherein the transition element and hollow regions comprise various shapes.
Figure 6:
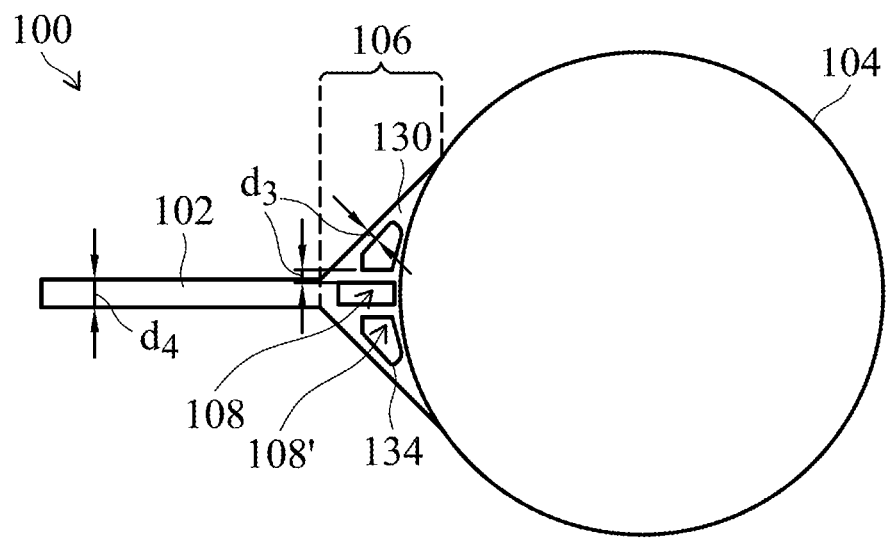
Figure 7:
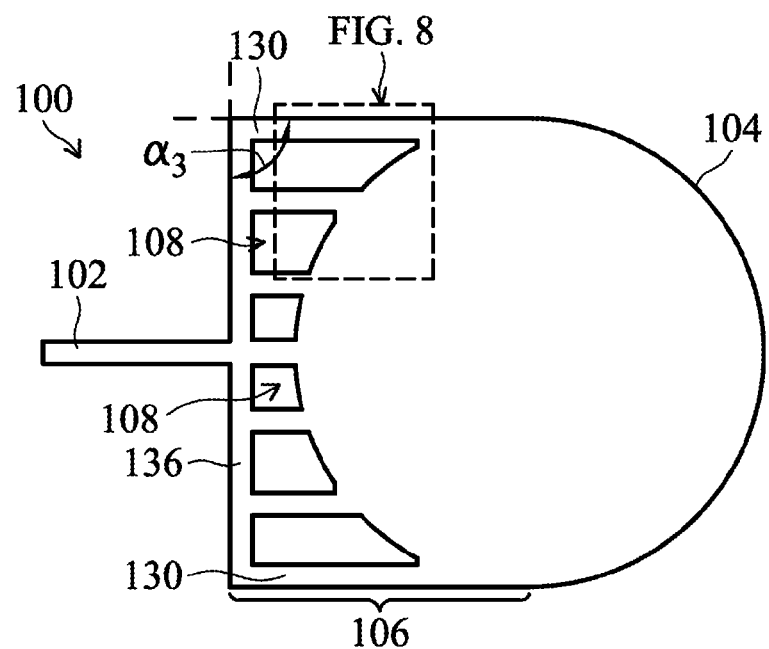

In some embodiments, the transition element 106 comprises a plurality of conjugation lines 130. The plurality of conjugation lines 130 is coupled between the PPI line 102 and the PPI pad 104. For example, FIGS. 5 through 7 are top views of a portion 100 of a packaging device in accordance with other embodiments, wherein the transition element 106 and hollow regions 108 and 108' comprise various shapes. In FIG. 5, the plurality of conjugation lines 130 is coupled between the PPI line 102 and the PPI pad 104 at a plurality of different angles with respect to the PPI line 102. Each angle is different from the other angles in the embodiment shown. Each of the conjugation lines 130 is not parallel to the PPI line 102. The hollow regions 108 comprise a shape of a triangle with a curved side, due to the curved side of the PPI pad 104. The conjugation lines 130 comprise a width comprising dimension $d_3$, wherein dimension $d_3$ is less than or equal to the width of the PPI line 102 comprising dimension $d_4$, as described for the previous embodiments.

In some embodiments, the plurality of conjugation lines 130 is coupled between the PPI line 102 and the PPI pad 104 at a plurality of different angles, and at least one of the plurality of conjugation lines 130 is positioned parallel to the PPI line 102. For example, in FIG. 6, some of the plurality of conjugation lines 130 are parallel to the PPI line 102. The two center conjugation lines 130 are positioned parallel to the PPI line 102. The other conjugation lines 130 are positioned between the PPI line 102 and the PPI pad 104 at different angles with respect to the PPI line 102. One hollow region 108 comprises a shape of a rectangle, and the other hollow regions 108' comprise a shape of a polygon with a curved side and a curved corner 134. Four conjugation lines 130 are shown in FIGS. 5 and 6; however, other numbers of conjugation lines 130 may also be included in the transition elements 106.

Figure 8:
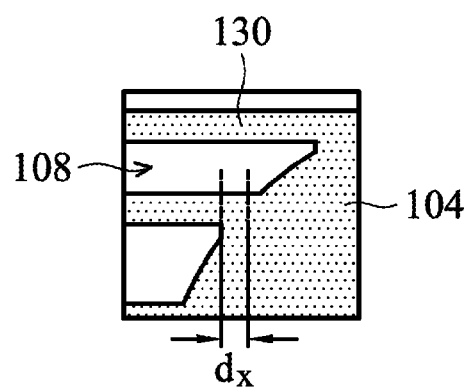
FIG. 8 is a more detailed view of a portion of FIG. 7 in accordance with some embodiments.

In FIG. 7, each of the plurality of conjugation lines 130 is disposed substantially parallel to the PPI line 102. The transition element 106 further includes a connection line 136 disposed substantially perpendicular to the PPI line 102. The connection line 136 is coupled to the PPI line 102. Each of the plurality of conjugation lines 130 is coupled between the connection line 136 and the PPI pad 104. The conjugation lines 130 are coupled to the connection line 136 at an angle $\alpha_3$, wherein angle $\alpha_3$ is not an acute angle. Angle $\alpha_3$ is substantially about 90 degrees in some embodiments, for example. The hollow regions 108 comprise a shape of a rectangle with a curved side or a square with a curved side. Because the conjugation lines 130 are disposed at a non-acute angle $\alpha_3$, wetting regions form on the conjugation lines 130 and are resistant to flowing further onto the connecting line 136, and thus resist flowing even further onto the PPI line 102. FIG. 8 is a more detailed view of a portion of FIG. 7, illustrating the contact points of the conjugation lines 130 with the PPI pad 104. The dimension $d_x$ comprises about 1 μm or greater in some embodiments, for example. In other embodiments, dimension $d_x$ comprises about 1 μm to about 2 μm, as another example. In some embodiments, the design of dimension $d_x$ is selected to avoid an acute angle of the conjugation lines 130, in order to achieve reduced stress concentration and an improved manufacturing process.

Figure 9:
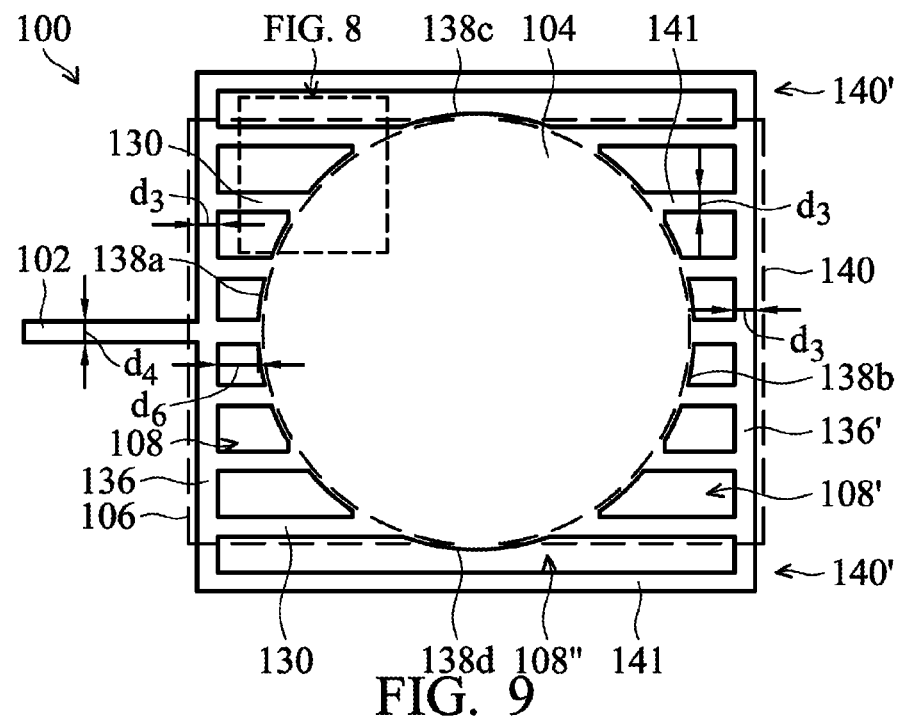
FIGS. 9 through 11 illustrate top views of some embodiments of the present disclosure wherein an extension element having hollow regions is coupled to the PPI pad.
Figure 10:
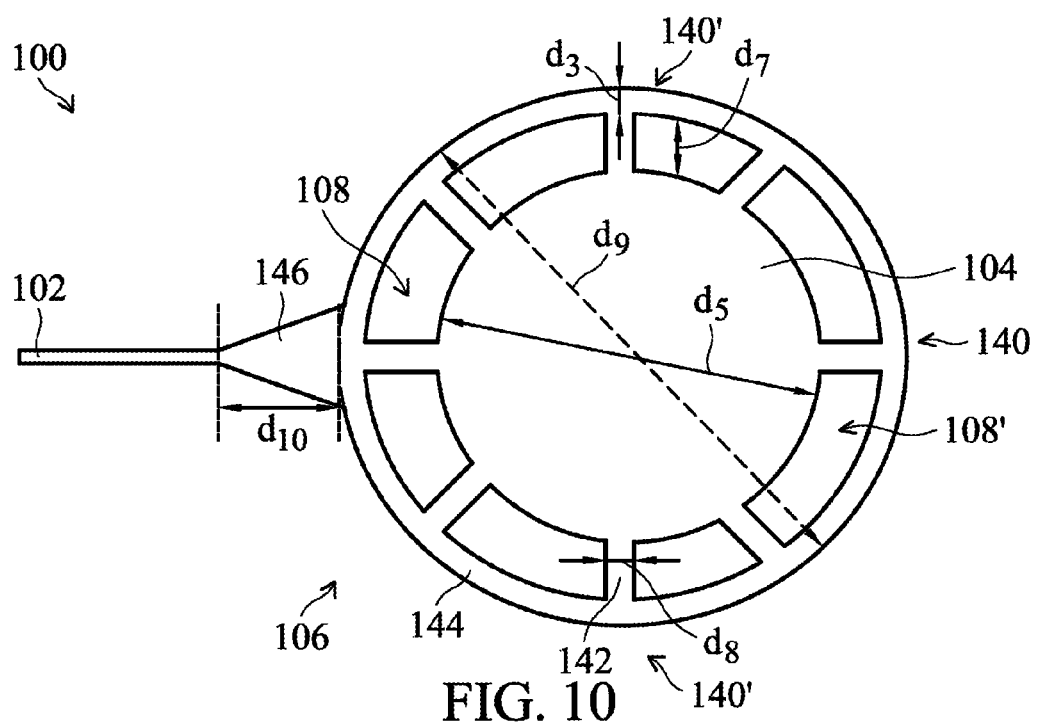
Figure 11:
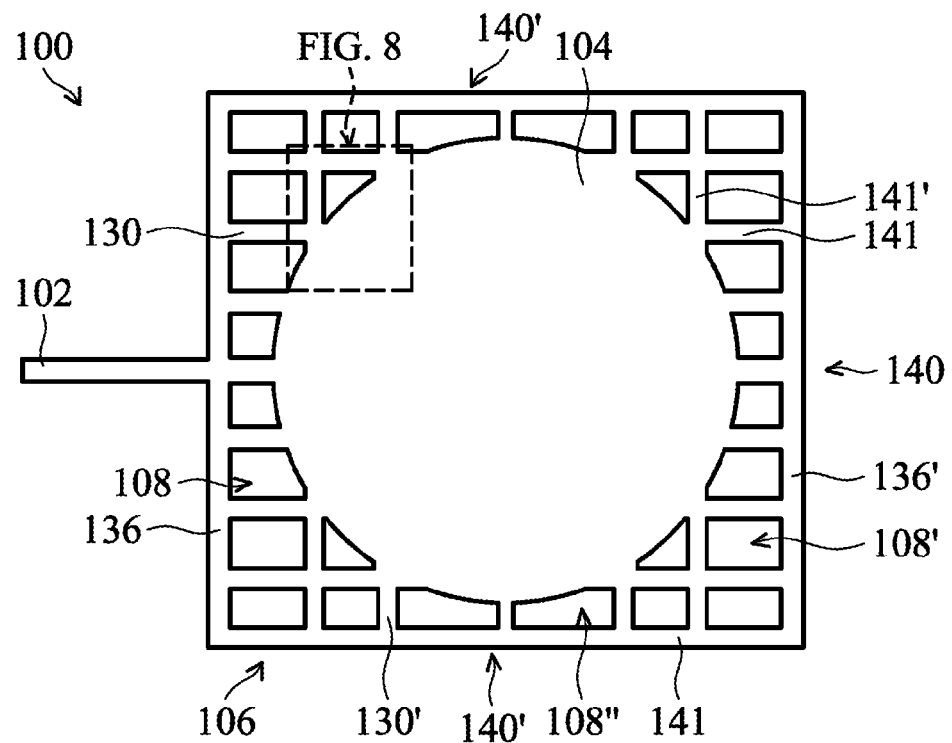

FIGS. 9 through 11 illustrate top views of embodiments of the present disclosure wherein an extension element 140 having hollow regions 108' is coupled to the PPI pad 104. For example, in FIG. 9, the embodiment shown in FIG. 7 is illustrated with the inclusion of an extension element 140. The PPI pad 138a has a first side 138a and a second side 138b opposite the first side 138a. The transition element 106 is coupled to the first side 138a of the PPI pad 104. The packaging device further includes an extension element 140 coupled to the second side 138b of the PPI pad 104. The extension element 140 includes a plurality of extension lines 141 coupled on one end to the second side 138b of the PPI pad 104 and coupled at the opposite end to a connecting line 136'. The extension element 140 comprises a hollow region 108'. In some embodiments, the extension element 140 comprises a plurality of hollow regions 108'. The hollow regions 108' have a shape of a rectangle with a curved side or a square with a curved side. The extension element 140 is formed simultaneously with the formation of the PPI lines 102, PPI pads 104, and transition elements 106 using the same method and comprising the material and thickness, in some embodiments.

In some embodiments, a portion of the extension element 140 has substantially the same shape as the transition element 106. For example, a portion of the transition element 106 may have a first shape, and a portion of the extension element 140 may have a second shape, wherein the second shape is substantially the same as the first shape, in some embodiments. The extension element 140 may also have a different shape than the transition element 106, in other embodiments. The extension lines 141 and connecting line 136' comprise a width comprising dimension $d_3$, wherein dimension $d_3$ is less than or equal to the width of the PPI line 102 comprising dimension $d_4$, in some embodiments.

In some embodiments, the extension element 140 further includes a portion that is coupled to a third side 138c and a fourth side 138d of the PPI pad 104, as shown at 140' in FIG. 9. The third side 138c of the PPI pad 104 is substantially perpendicular to the first side 138a of the PPI pad 104, and the fourth side 138d of the PPI pad 104 is opposite the third side 138c of the PPI pad 104. A portion 140' of the extension element 140 coupled to the third side 138c and the fourth side 138d of the PPI pad 104 is coupled to the transition element 106, for example, by an extension line 141. The extension element 140' includes a hollow region 108'' comprising a shape of a rectangle with a curved side. A more detailed view of a portion of the transition element 106 is shown in FIG. 8.

The extension elements 140 or 140/140' provide additional wetting regions for the flow of eutectic material of the conductive material 120, further preventing wetting onto the PPI line 102. Furthermore, the PPI line 102 may be placed closer to the PPI pad 104 in some embodiments. For example, dimension $d_6$ comprising a length of a shortest conjunction line 130 proximate the PPI line 102 comprises about 10 μm or greater in some applications. Dimension $(d_3+d_6)$ is less than dimension $d_1$ for the embodiments shown in FIG. 1, in some embodiments, for example. Dimension $d_6$ may also comprise other values.

FIG. 10 illustrates a top view of some embodiments wherein the transition element 106 and the extension element 140/140' comprise a ring member 144 coupled to the PPI line 102 and a plurality of radial members 142 coupled between the PPI pad 104 and the ring member 144. The ring member 144 comprises a shape of an annulus having a thickness comprising dimension $d_3$. Dimension $d_3$ is less than or equal to the width of the PPI line 102 comprising dimension $d_4$, in some embodiments. The radial members 142 comprise a length comprising dimension $d_7$ and a width comprising dimension $d_8$. Dimension $d_7$ comprises about 20 μm and dimension $d_8$ comprises about 10 to about 20 μm in some embodiments, as examples. The outside diameter of the ring member 144 comprises dimension $d_9$, wherein dimension $d_9$ comprises about 240 μm in some embodiments. Dimensions $d_7$, $d_8$, and $d_9$ may also comprise other values. The hollow regions 108 each comprise a shape of a fragment of an annulus in these embodiments.

The embodiments shown in FIG. 10 also include a triangle member 146 coupled between the PPI line 102 and the ring member 144. The triangle member 146 comprises a width comprising dimension $d_{10}$, wherein dimension $d_{10}$ comprises about 40 μm in some applications, for example. Dimension $d_{10}$ may also comprise other values. The triangle member 146 comprises a portion of the transition element 106 in some embodiments, for example. The triangle member 146 may also be included in the other embodiments described herein, not shown in the drawings.

FIG. 11 is a top view of some embodiments wherein the transition element 106 and extension element 140/140' comprise a grid shape. The plurality of conjugation lines 130 of the transition element 106 that are parallel to the PPI line 102 comprises a plurality of first conjugation lines 130. The transition element 106 further comprises a plurality of second conjugation lines 130'. The plurality of second conjugation lines 130' are disposed substantially perpendicular to the PPI line 102. Each of the plurality of second conjugation lines 130' is coupled to the PPI pad 104 or to one of the plurality of first conjugation lines 130. At the edges, the plurality of second conductive lines 130' is coupled to the extension line 141. Likewise, the extension element 140/140' includes a plurality of extension lines 141 that are parallel to the PPI line 102 and a plurality of second extension lines 141' that are substantially perpendicular to the PPI line 102. Each of the plurality of second extension lines 141' is coupled to the PPI pad 104 or to one of the plurality of first extension lines 141. A more detailed view of a portion of the transition element 106 is shown in FIG. 8.

Figure 12:
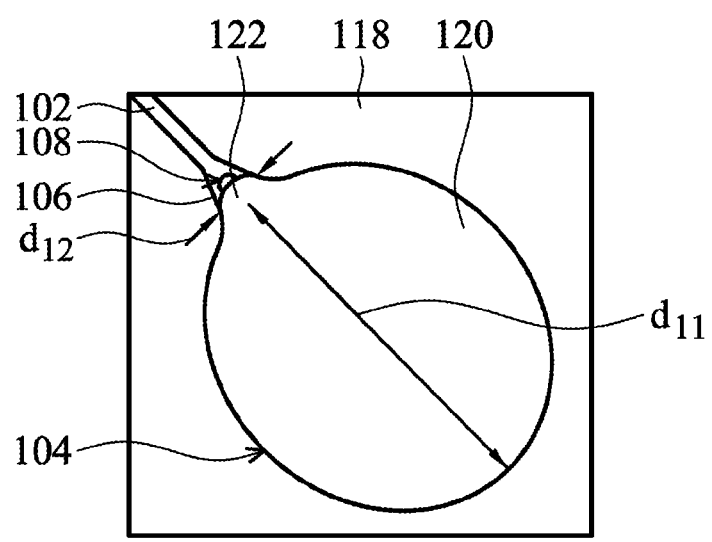
FIG. 12 is a top view of a conductive material coupled to a PPI pad that includes a transition element with a hollow region coupled thereto in accordance with some embodiments.

FIG. 12 is a top view of a conductive material 120 coupled to a PPI pad 104 that includes a transition element 106 with a hollow region 108 coupled thereto in accordance with some embodiments. The wetting region 122 does not extend past the hollow region 108. The wetting region 122 is not formed on the PPI line 102. Experimental results for a PPI pad 104 having a diameter comprising dimension $d_5$ of about 200 μm showed the formation of a conductive material 120 comprising a solder ball having a diameter comprising dimension $d_{11}$ of about 300 μm, a ball height of about 205 μm, and a wetting region 122 having a necking width comprising dimension $d_{12}$ of about 34 μm, as an example.

Figure 13:
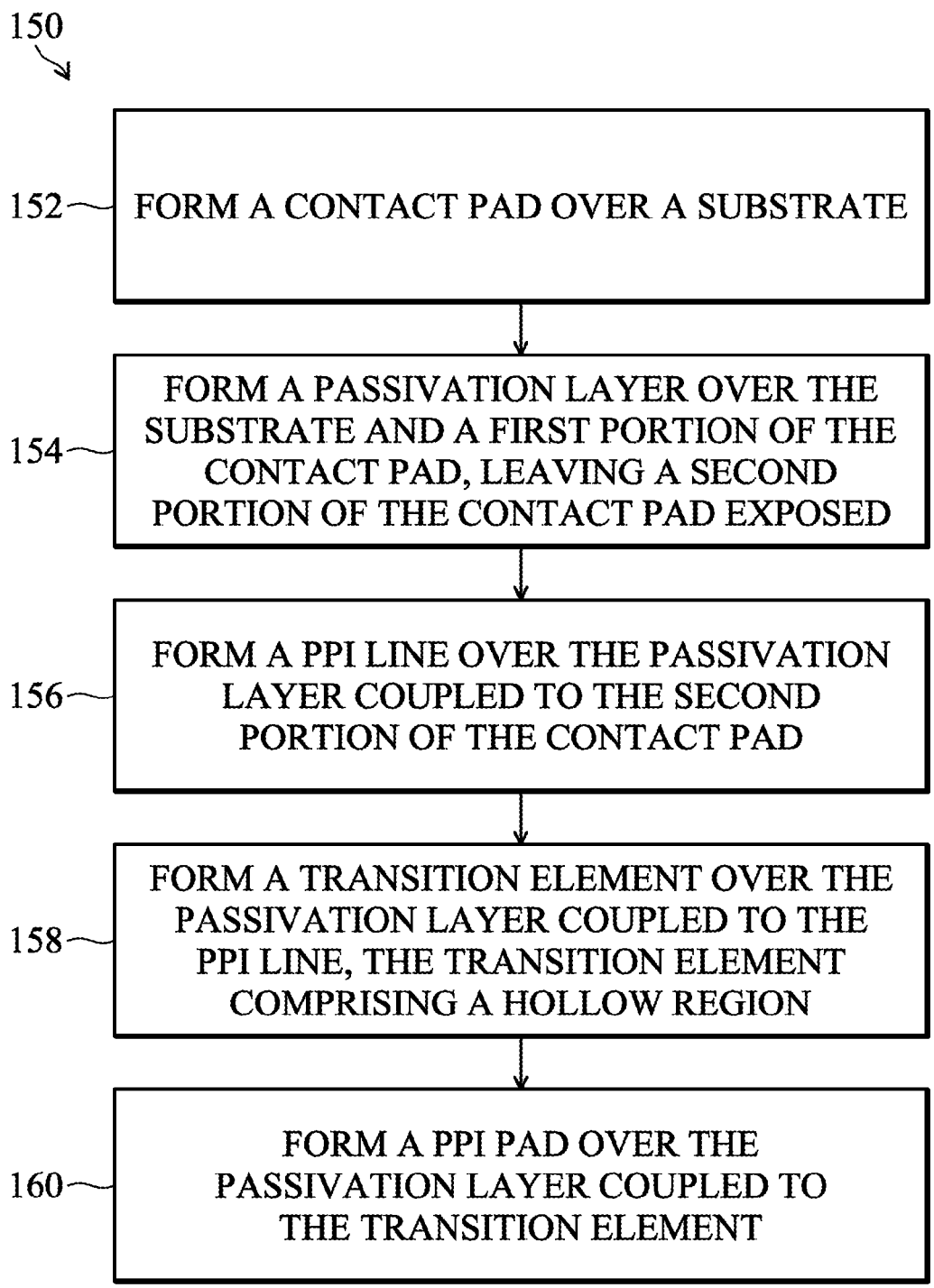
FIG. 13 is a flow chart illustrating a method of manufacturing a packaging device in accordance with some embodiments.

FIG. 13 is a flow chart 150 illustrating a method of manufacturing a packaging device 110 (see also FIG. 4) in accordance with some embodiments of the present disclosure. In step 152, a contact pad 114 is formed over a substrate 112. In step 154, a passivation layer 118 is formed over the substrate 112 and a first portion of the contact pad 114 yet leaving a second portion of the contact pad 114 exposed. In step 156, a PPI line 102 is formed over the passivation layer 118 coupled to the second portion of the contact pad 114. In step 158, a transition element 106 is formed over the passivation layer 118 coupled to the PPI line 102, the transition element comprising a hollow region 108. In step 160, a PPI pad 104 is formed over the passivation layer 118 coupled to the transition element 106.

In some embodiments of the present disclosure, the transition elements 106 between a PPI line 102 and a PPI pad 104 are substantially tangential to sides of the PPI pads 104 (see the embodiments illustrated in FIGS. 1, 2, 5, and 6). In other embodiments, the transition elements 106 comprise sides that are not tangential to sides of the PPI pads 104, to be described further herein.

Figure 14:
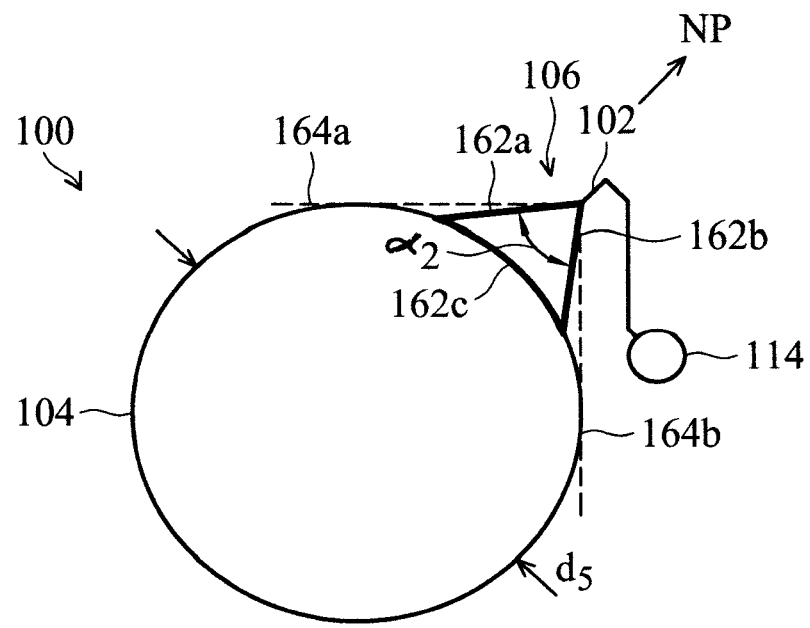
FIGS. 14 through 16 are top views that illustrate transition elements in accordance with some embodiments of the present disclosure.
Figure 15:
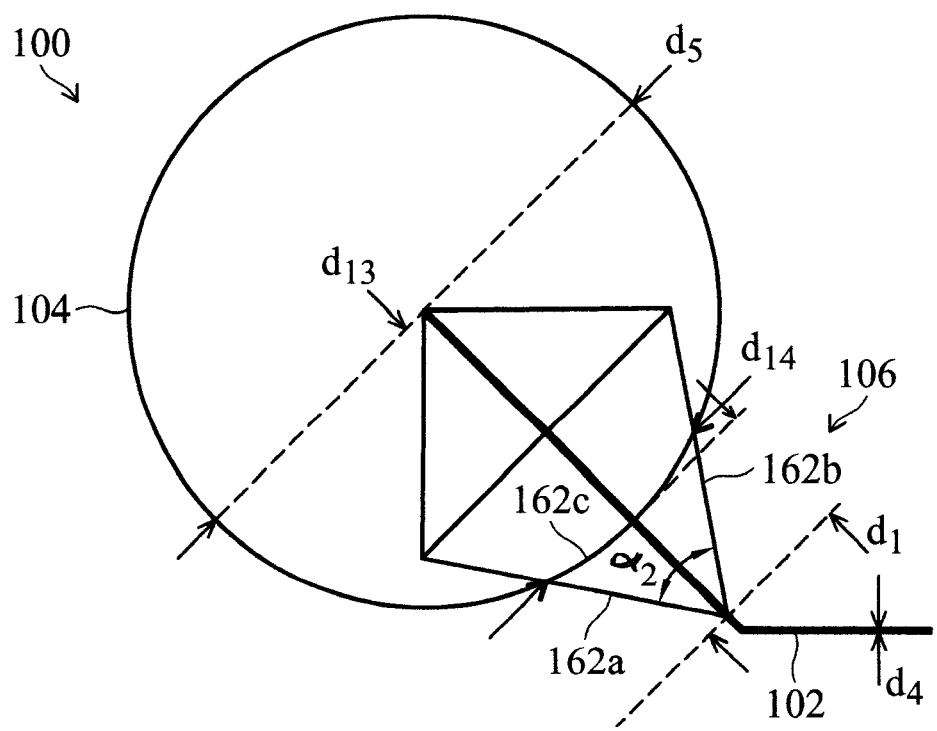
Figure 16:
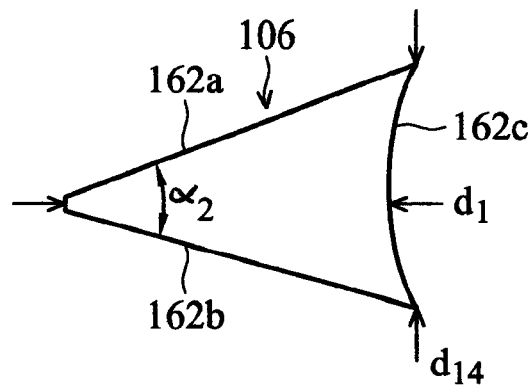

For example, FIGS. 14 through 16 illustrate some embodiments of the present disclosure wherein a transition element 106 comprises an angle $\alpha_2$ of less than about 90 degrees with respect to a PPI line 102. The transition element 106 also comprises sides 162a and 162b that are non-tangential to the PPI pad 104. Top views of portions 100 of packaging devices 110 (see packaging devices 110 shown in FIGS. 17, 19, 21, and 23 through 25) are shown in FIGS. 14 through 16.

The transition element 106 comprises a first side 162a, a second side 162b, and a third side 162c, as shown in FIG. 14. The second side 162b is coupled to the first side 162a at one end of the second side 162b. The second side 162b is coupled to the third side 162c at an opposite end of the second side 162b. The third side 162c is coupled to both the first side 162a and the second side 162b at one end of the third side 162c and at an opposite end of the third side 162c. The first side 162a and the second side 162b of the transition element 106 are substantially straight, and the third side 162c is curved. The third side 162c of the transition element 106 is coupled to the PPI pad 104 and is curved proximate the PPI pad 104 in some embodiments, for example.

The non-tangential transition elements 106 comprise a bird's beak design in some embodiments that comprises about a 70 degree angle proximate the PPI line 102.

The first side 162a and the second side 162b of the transition element 106 are non-tangential to the PPI pad 104. For example, in FIG. 14, tangential lines 164a and 164b from the PPI line 102 to the PPI pad 104 are illustrated in phantom. Rather than being tangential to the PPI pad 104, the sides 162a and 162b of the transition element 106 are not tangential (e.g., non-tangential) to the PPI pad 104 and lie within the illustrated tangential lines 164a and 164b.

The PPI line 102 coupled between the underlying contact pad 114 and the transition element 106 comprises a meandering path in a top view in some embodiments, also illustrated in FIG. 14. The PPI line 102 may also be substantially straight and may meander in other directions and shapes.

An angle $\alpha_2$ between the first side 162a of the transition element 106 and the second side 162b of the transition element 106 proximate the PPI line 102 comprises about 90 degrees or less in some embodiments. The angle $\alpha_2$ comprises about 40 degrees to about 85 degrees in some embodiments, for example. In other embodiments, the angle $\alpha_2$ comprises about 65 degrees to about 75 degrees, as another example. In some embodiments, the angle $\alpha_2$ between the substantially straight sides 162a and 162b of the transition element 106 comprises about 70 degrees. The angle $\alpha_2$ between the sides 162a and 162b may also comprise other dimensions.

FIG. 14 also illustrates that the transition element 106 comprises a substantially triangular shape in some embodiments. The transition element 106 may comprise a substantially triangular shape with one curved side, i.e., the third side 162c. In some embodiments, a corner of the triangular shaped transition element 106 may point towards a center or a neutral point (NP) of an array 165 (not shown in FIG. 14; see FIG. 17) of PPI pads 104, to be described further herein. The bird's beak design of the transition element 106 is centripetally positioned within the array 165 in some embodiments, for example.

FIG. 15 illustrates some additional relative dimensions of the PPI pad 104, transition element 106, and PPI line 102 in accordance with some embodiments, wherein the transition element 106 comprises first and second sides 162a and 162b that are non-tangential to the PPI pad 104. Dimensions $d_1$ and $d_4$ have been previously described herein (see FIG. 1, for example). Dimension $d_{13}$ comprises a distance between the PPI line 102 and a center of the PPI pad 104. Dimension $d_{13}$ comprises about 100 μm to about 300 μm in some embodiments, for example. In other embodiments, dimension $d_{13}$ comprises about 110 μm to about 280 μm, as another example. These values for dimension $d_{13}$ are sufficient to provide enhanced mechanical strength and to reinforce reliability of a packaging device 110 by avoiding or preventing cracks at the necks of the PPI pads 104, for example. Dimension $d_{13}$ may also comprise other values. A widest width of the third side 162c of the transition element 106 proximate the PPI pad 104 comprises a dimension $d_{14}$, wherein dimension $d_{14}$ comprises about 150 μm, as an example. Dimension $d_{14}$ may comprise about ⅓ to about ⅔ of a width comprising dimension $d_5$ of the PPI pad 104 in some embodiments, for example. Dimension $d_{14}$ may also comprise other values and/or other relative dimensions to the PPI pad 104.

FIG. 16 illustrates a top view of a transition element 106 that comprises the first side 162a, the second side 162b, and the third side 162c. FIG. 16 also illustrates the angle $\alpha_2$ between the first side 162a and second side 162b of the transition element 106, and the length and width comprising dimension $d_1$ and $d_{14}$, respectively, of the transition element 106.

The transition elements 106 illustrated in FIGS. 14 through 16 may include a hollow region 108 as described for the embodiments shown in FIGS. 1 through 13. In other embodiments, the transition elements 106 illustrated in FIGS. 14 through 16 may not include a hollow region 108, as illustrated in FIGS. 14 through 16. Likewise, the transition elements 106 shown in FIGS. 14 through 16 may include extension elements and/or conjugation lines, not shown. In other embodiments, the transition elements 106 illustrated in FIGS. 14 through 16 may not include extension elements and/or conjugation lines, as illustrated in FIGS. 14 through 16.

The transition elements 106 that include the first and second sides 162a and 162b having an angle $\alpha_2$ between them and that are non-tangential to the PPI pads 104 may be included in an entire array of PPI pads 104 of a packaging device 110 in some embodiments. In other embodiments, the transition elements 106 that include the first and second sides 162a and 162b having an angle $\alpha_2$ between them and that are non-tangential to the PPI pads 104 may be included in a portion of an array of PPI pads 104 of a packaging device 110, to be described further herein with reference to FIGS. 17 through 22.

Figure 17:
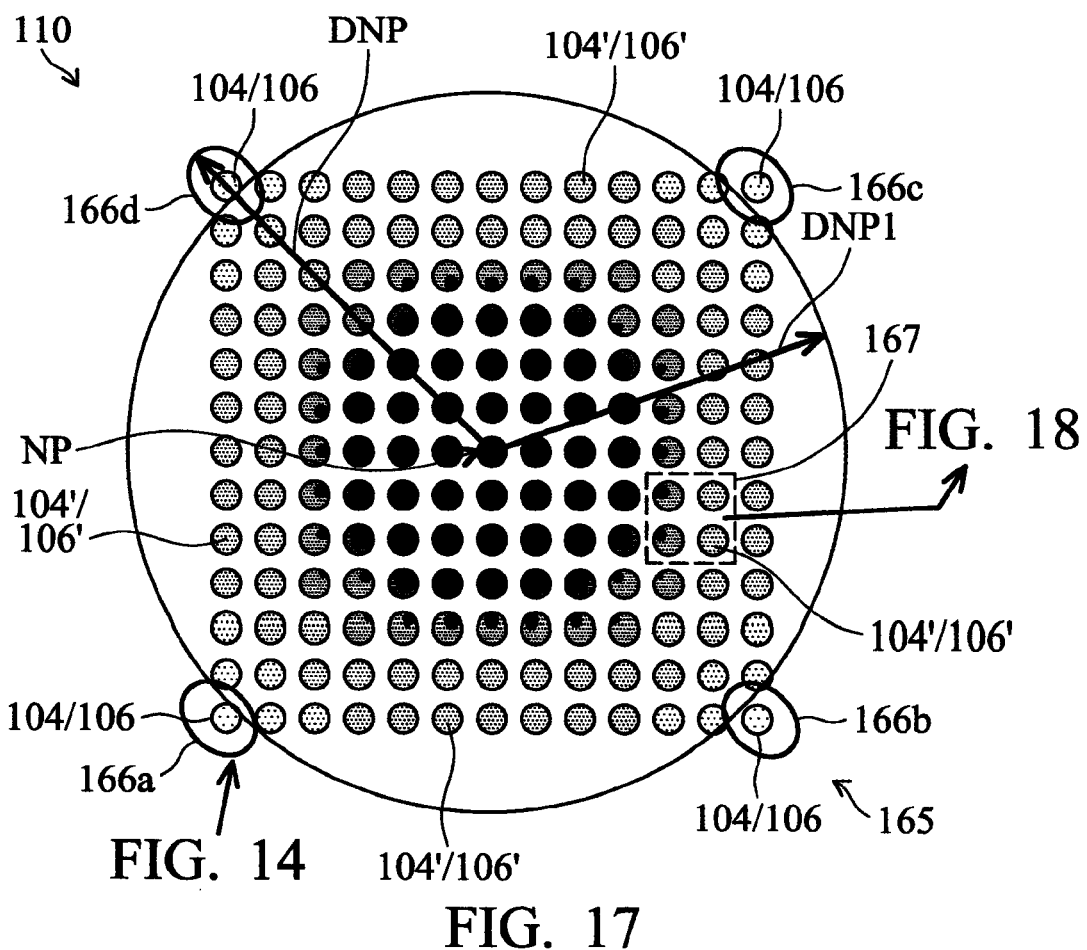
FIG. 17 is a top view illustrating a packaging device that includes an array of PPI pads in accordance with some embodiments that includes the transition elements shown in FIGS. 14 through 16 in corners of the array.

Some positions of PPI pads 104 within an array of PPI pads 104 may be more susceptible to breakage and fracture in some embodiments, such as in larger packaging types having a large number of contact pads 114 and PPI pads 104. PPI pads 104 in corners 166a, 166b, 166c, and 166d of an array 165 of the PPI pads 104 of a packaging device 110 may be more susceptible to breakage, for example, as shown in FIG. 17 in a top view. The transition elements 106 having non-tangential sides 162a and 162b may be implemented in such packaging devices 110, to reduce or eliminate breakage and increase yields.

For example, the top view shown in FIG. 17 illustrates a packaging device 110 that includes an array 165 of PPI pads 104 and 104' in accordance with some embodiments of the present disclosure. The transition elements 106 shown in FIGS. 14 through 16 are included in the corners 166a, 166b, 166c, and 166d of the array 165 and are coupled to the PPI pads 104 (e.g., shown collectively at 104/106), in some embodiments. Other regions 167 of the array 165 may include transition elements 106' with other shapes and other relative shapes to the PPI pads 104'. The transition elements 106 that are non-tangential to PPI pads 104 are only included in the corners 166a, 166b, 166c, and 166d of the array 165 in the embodiments shown in FIG. 17; the other regions 167 of the array 165 may include tangential transition elements 106' to PPI pads 104'.

For example, the corners 166a, 166b, 166c, and 166d of the array 165 shown in FIG. 17 include the transition elements 106 described herein with reference to FIGS. 14 through 16 coupled to the PPI pads 104. The transition elements 106 and PPI pads 104 are labelled collectively as 104/106 in FIG. 17. The transition elements 106 and PPI pads 104 are also referred to herein as first transition elements 106 and first PPI pads 104, respectively. Likewise, the PPI lines 102 and contact pads 114 for the first transition elements 106 are also referred to herein as first PPI lines 102 and first contact pads 114, respectively.

Figure 18:
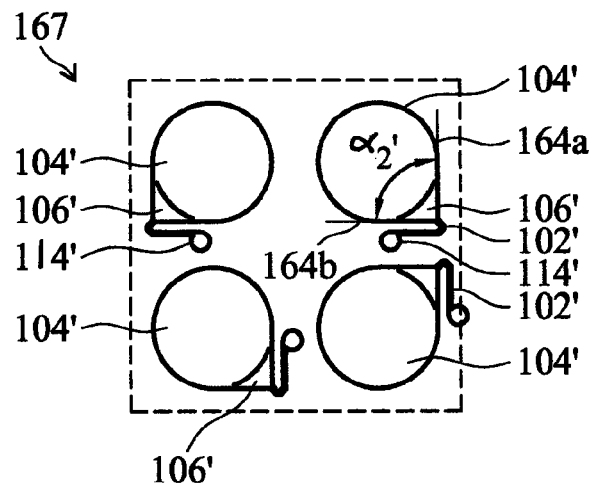
FIG. 18 is a more detailed view of a portion of the packaging device shown in FIG. 17 in accordance with some embodiments.

Other regions 167 of the array 165 may include transition elements 106' that have substantially straight sides and that are substantially tangential to the PPI pads 104', as illustrated in a more detailed view in FIG. 18. The transition elements 106' and PPI pads 104' are labelled collectively as 104'/106' in FIG. 17. The angle $\alpha_2'$ between the substantially straight sides of the transition elements 106' comprises about 90 degrees in some embodiments, for example. The transition elements 106' and PPI pads 104' in regions 167 are also referred to herein as second transition elements 106' and second PPI pads 104', respectively. Likewise, the PPI lines 102' and contact pads 114' for the second transition elements 106' are also referred to herein as second PPI lines 102' and second contact pads 114', respectively.

In some embodiments, an analysis of a distance from a neutral position NP to a PPI pad 104 or 104' may be made to determine if a higher likelihood of cracking or breaking of connections to the PPI pads 104 or 104' exists, in order to determine which regions of the array 165 of PPI pads 104 and 104' would benefit from utilizing the transition elements 106 illustrated in FIGS. 14 through 16 and described herein. For example, a desired value of a distance to the neutral point (DNP1) for PPI pads of the array 165 may be determined, and a measurement or estimate of the actual distances to the neutral point (DNP) to each of the PPI pads 104 and 104' may then be made. The neutral position NP may comprise a center of the array 165 of PPI pads 104 and 104' in some embodiments. The NP may also be located elsewhere in the array 165. PPI pads 104 having a DNP measurement or estimate that is greater than the predetermined desired value of the distance to the neutral point, DNP1, may be designed to be connected to underlying contact pads 114 using the transition elements 106 described herein with reference to FIGS. 14 through 16, which have an angle $\alpha_2$ of about 70 degrees and have sides that are non-tangential to the PPI pads 104 in some embodiments, for example. PPI pads 104' in region 167 may have a DNP measurement or estimate that is less than or equal to DNP1, and the packaging device 110 may be designed such that the PPI pads 104' are connected to underlying contact pads 114' using the transition elements 106' shown in FIG. 18 which have an angle $\alpha_2'$ of about 90 degrees and are substantially tangential to the PPI pads 104' in some embodiments.

Each of the transition elements 106 and 106' comprises a substantially triangular shape in some embodiments. A corner of each of the triangular shaped transition elements 106 in the corner regions 166a, 166b, 166c, and 166d points towards a center or an NP of the array 165 of PPI pads 104 and 104' in some embodiments. For example, FIG. 14 illustrates some embodiments wherein a lower corner 166a of an array 165 shown in FIG. 17 includes a transition element 106 coupled to a PPI pad 104. A corner of the transition element 106 at the intersection of the first side 162a and the second side 162b points towards the NP shown in FIG. 17, e.g., the corner of the transition element 106 points towards the upper right of the array 165. Likewise, transition elements 106 may be positioned so that corners of the transition elements 106 at the first side 162a and second side 162b intersections in the other corners 166b, 166c, and 166d of the array 165 point towards the NP.

Figure 19:
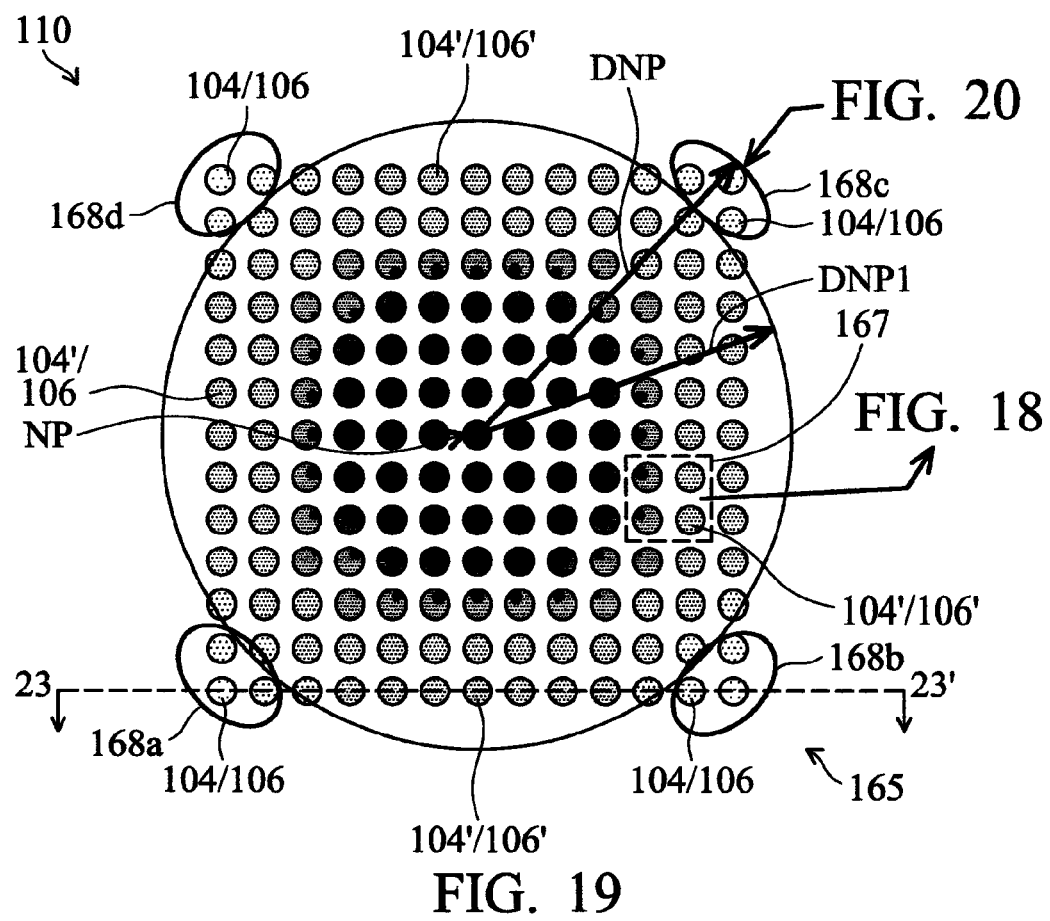
FIG. 19 is a top view illustrating a packaging device that includes an array of PPI pads in accordance with some embodiments that includes the transition elements shown in FIGS. 14 through 16 in corner regions of the array.
Figure 21:
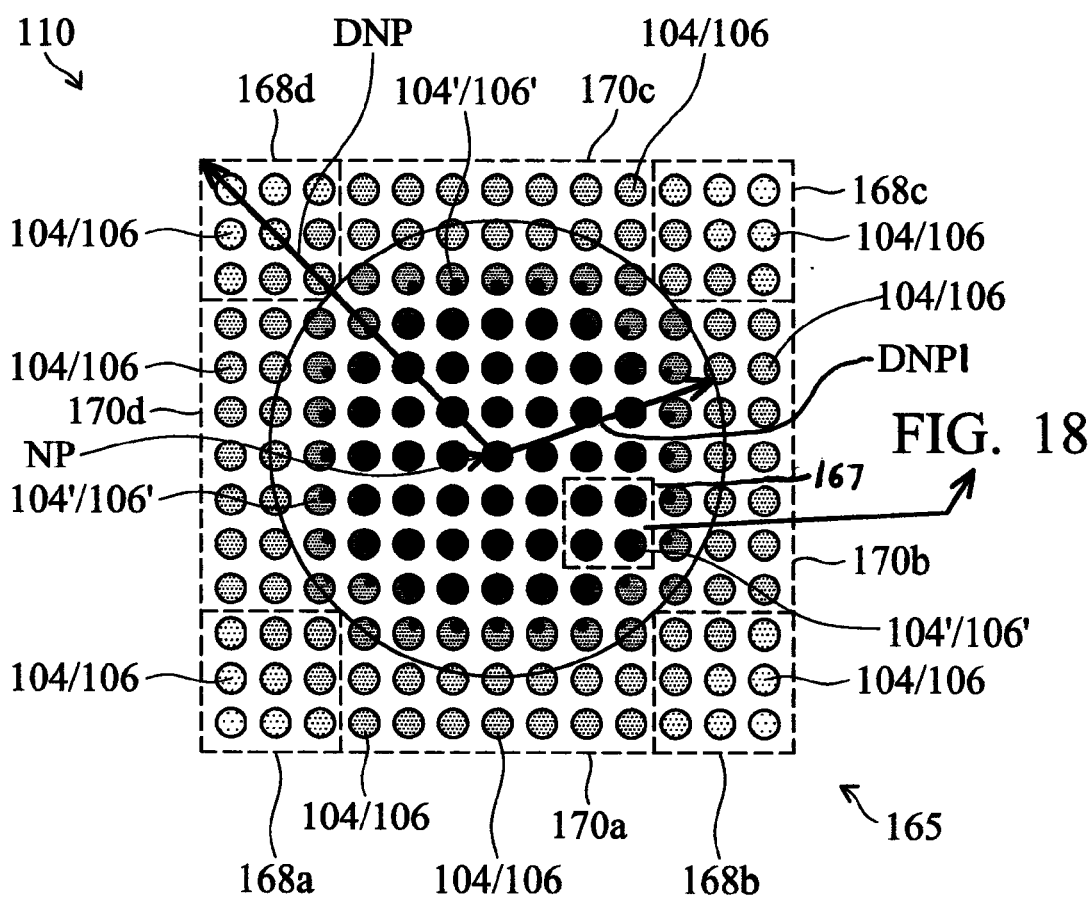
FIG. 21 is a top view illustrating a packaging device that includes an array of PPI pads in accordance with some embodiments that includes the transition elements shown in FIGS. 14 through 16 in corner regions and edge regions of the array.

In some of the embodiments shown in FIG. 17, only the corners 166a, 166b, 166c, and 166d of the array 165 include the non-tangential transition elements 106 shown in FIGS. 14 through 16. In other embodiments, other regions of the array 165 of PPI pads 104 and/or 104' than the corners 166a, 166b, 166c, and 166d may also include the non-tangential transition elements 106 shown in FIGS. 14 through 16, as illustrated in FIGS. 19 and 21. For array 165 designs that are relatively large and/or that have a lower DNP1, the transition elements 106 that are non-tangential to PPI pads 104 and include a 70 degree angle $\alpha_2$ may be implemented over a greater surface area of the array 165 or in additional regions of the array 165, for example.

FIG. 19 is a top view illustrating a packaging device 110 comprising an array 165 of PPI pads 104 and 104' in accordance with some embodiments that includes the non-tangential transition elements 106 shown in FIGS. 14 through 16. Corner regions 168a, 168b, 168c, and 168d include the transition elements 106 described herein coupled to the PPI pads 104, illustrated at 104/106. The other regions 167 of the array 165 include transition elements 106' coupled to the PPI pads 104', illustrated at 104'/106', as described for FIG. 17 and as illustrated in more detail in FIG. 18. The DNP1 shown in FIG. 19 may be smaller than the DNP1 shown in FIG. 17, or the packaging device 110 and/or array 165 shown in FIG. 19 may be larger than the packaging device 110 and/or array 165 shown in FIG. 17, as examples.

Figure 23:
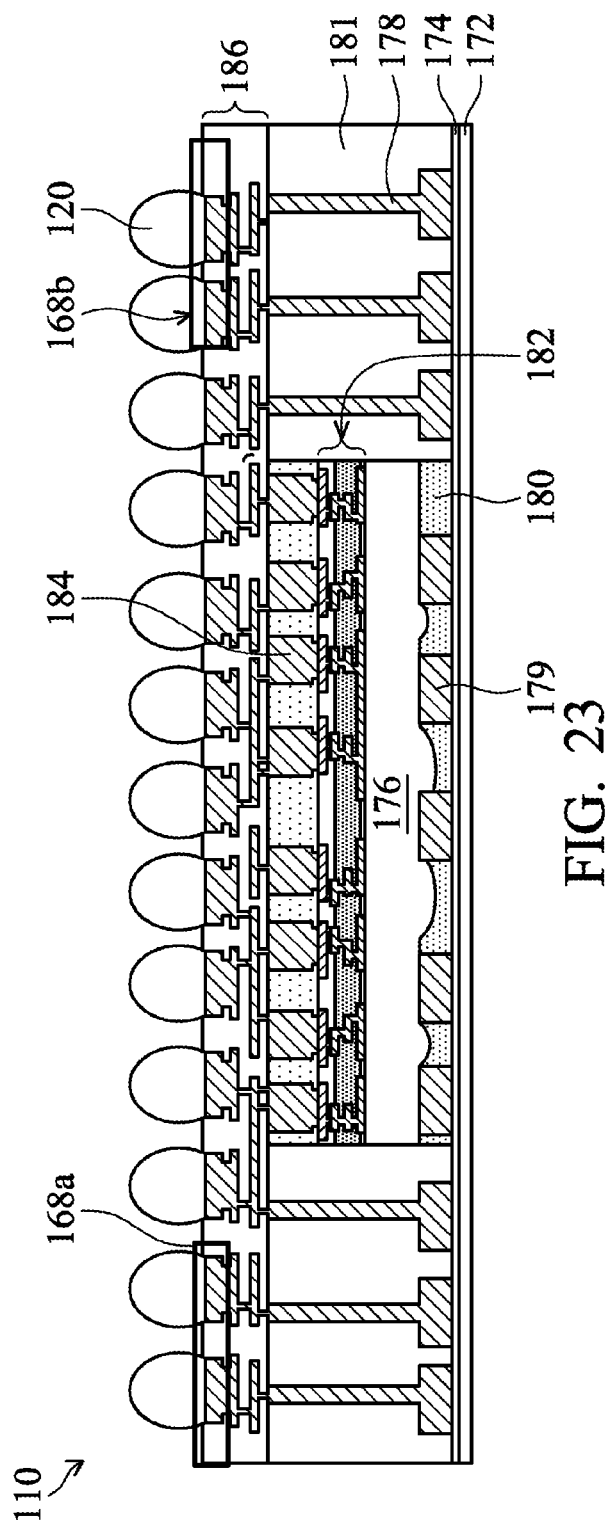
FIG. 23 is a cross-sectional view of a packaging device in accordance with some embodiments.

A cross-sectional view of the packaging device 110 at 23-23' is shown in FIG. 23, which will be described further herein.

Figure 20:
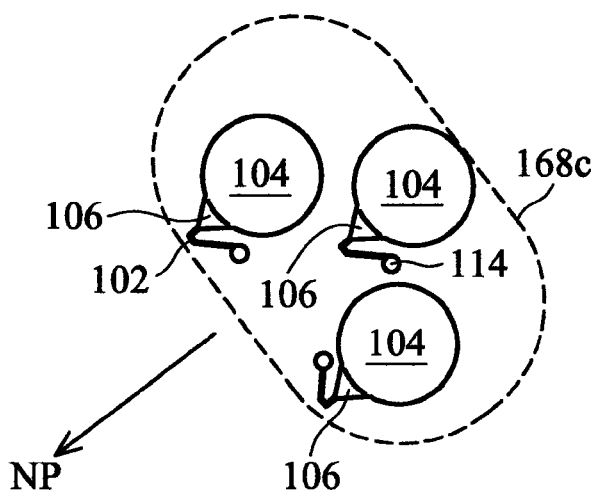
FIG. 20 is a more detailed view of a portion of the packaging device shown in FIG. 19 in accordance with some embodiments.

FIG. 20 is a more detailed view of a portion of the packaging device 110 shown in FIG. 19 in accordance with some embodiments. An upper right corner region 168c of the array 165 shown in FIG. 19 is illustrated in FIG. 20. Corners of the transition elements 106 at the intersections of the first sides 162a and the second sides 162b (not labelled in FIG. 20; see FIG. 14) point towards the NP shown in FIG. 19; e.g., the corners of the transition elements 106 point towards the lower left of the array 165 towards the NP. Likewise, transition elements 106 in the other corner regions 168a, 168b, and 168d may be positioned so that corners of the transition elements 106 at the first side 162a and second side 162b intersections point towards the NP.

The corner regions 168a, 168b, 168c, and 168d illustrated in FIGS. 19 and 20 each comprise three PPI pads 104 and three transition elements 106. The corner regions 168a, 168b, 168c, and 168d may also comprise other numbers of PPI pads 104 and transition elements 106. For example, FIG. 21 is a top view illustrating a packaging device 110 that includes an array 165 of PPI pads 104 and 104' in accordance with some embodiments that includes the transition elements 106 shown in FIGS. 14 through 16. The corner regions 168a, 168b, 168c, and 168d are larger than in FIG. 19 and each include nine PPI pads 104 and nine transition elements 106. Region 167 of the array 165 includes PPI pads 104' and transition elements 106' that are tangential to the PPI pads 104', as described for the other embodiments and as shown in more detail in FIG. 18.

The transition elements 106 shown in FIGS. 14 through 16 are also included in edge regions 170a, 170b, 170c, and 170d in the embodiments shown in FIG. 21. The value of DNP1 in FIG. 21 is less than the value of DNP1 in FIGS. 17 and 19, and/or the array 165 or packaging device 110 is larger in FIG. 21 than in FIGS. 17 and 19, for example. As in the other embodiments, corners of the transition elements 106 may be positioned to point towards the NP.

Figure 22:
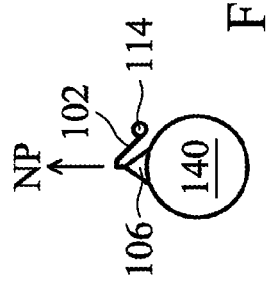
FIG. 22 is a more detailed view of a portion of the packaging device shown in FIG. 21 in accordance with some embodiments.

FIG. 22 is a more detailed view of a portion of the packaging device 110 shown in FIG. 21 in accordance with some embodiments. A PPI pad 104 and transition element 106 in the lower edge region 170a is shown, wherein the PPI pad 104 and transition element 106 are disposed in a substantially central region of the lower edge region 170a. A corner of the transition element 106 at the intersections of the first sides 162a and the second sides 162b (not shown in FIG. 22; see FIG. 14) points towards the NP shown in FIG. 21; e.g., the corner of the transition element 106 points towards the upper part of the array 165 towards the NP. Likewise, the transition elements 106 in the other edge regions 170b, 170c, and 170d and the corner regions 168a, 168b, 168c, and 168d may be positioned so that corners of the transition elements 106 at the first side 162a and second side 162b intersections point towards the NP.

FIG. 23 is a cross-sectional view of a packaging device 110 in accordance with some embodiments. The packaging device 110 may comprise a WLP that includes fan-out structures in some embodiments, for example. The packaging device 110 may also comprise other types of packages.

The packaging device 110 may include an adhesive 172 such as a glue, tape, or other materials with adhesive properties. An insulating material 174 is formed over the adhesive 172. The insulating material 174 may comprise PBO, PI, BCB, solder resist (SR), other materials, or a combination or multiple layers thereof, for example. The insulating material 174 may also comprise other materials. Layers 174 and 172 comprise a glue/polymer base buffer layer in some embodiments, for example.

A plurality of through-vias 178 is disposed over the insulating material 174. Conductive features (not labelled) may be formed over the insulating material 174, and some of the through-vias 178 are coupled to the conductive features, for example. The through-vias 178 and conductive features may be formed using a plating process, and a seed layer may be included for the plating process. The through-vias 178 and conductive features may comprise copper, a copper alloy or other materials, as examples. The conductive features coupled to the insulating material 174 and the through-vias 178 may comprise a part of a RDL or a PPI structure in some embodiments. The conductive features may comprise conductive lines, vias, contact pads, and/or other types of features. The conductive features comprise conductive features of a back side RDL in some embodiments.

The through-vias 178 may comprise a width of about 20 µm to about 300 µm in a top view. The through-vias 178 may comprise a circular, oval, square, rectangular, or polygon shape in the top view, as examples. The through-vias 178 may also comprise other shapes and dimensions. The through-vias 178 provide vertical electrical connections for the packaging device 110 in some embodiments, for example. The conductive features coupled to the lower ends of the through-vias 178 may comprise an under-ball metallization (UBM) structure in some embodiments.

The packaging device 110 includes an integrated circuit die 176 disposed in a die mounting region disposed between the through-vias 178. The integrated circuit die 176 may be coupled to some of the conductive features of the back side RDL in some embodiments, for example. One integrated circuit die 176 is shown in FIG. 23; however, the packaging device 110 may include two or more integrated circuit dies 176, or an integrated circuit die 176 may not be included in the packaging device 110. The integrated circuit die or dies 176 may include a substrate and active regions that contain circuitry disposed within the substrate. The integrated circuit dies 176 may also include interconnect structures and/or contact pads formed thereon. For example, on a lower side of the integrated circuit die 176 shown in FIG. 23, contact pads 179 are disposed within an insulating material 180. An interconnect structure 182 comprising conductive lines and vias is formed on an upper side of the integrated circuit die 176 in FIG. 23, for example. Contact pads 184 are formed on portions of the interconnect structure 182. The integrated circuit die or dies 176 may also include other features and/or elements.

A molding material 181 is formed around the integrated circuit dies 176 and the through-vias 178. The molding material 181 comprises a molding compound comprised of an insulating material, such as an epoxy, a filler material, a stress release agent (SRA), an adhesion promoter, other materials, or combinations thereof, as examples.

An interconnect structure 186 is formed over the molding material 181, the plurality of integrated circuit dies 176, and the plurality of through-vias 178. The interconnect structure 186 comprises one or more conductive feature layers and one or more insulating material layers. The interconnect structure 186 comprises an RDL or PPI structure in some embodiments. The conductive feature layers of the interconnect structure 186 may comprise conductive lines, conductive vias, and/or contact pads comprised of copper, copper alloys, or other materials, as examples. The insulating material layers of the interconnect structure 186 may comprise silicon dioxide, low dielectric constant (k) materials having a k value less than silicon dioxide, passivation materials, other insulating materials, or multiple layers or combinations thereof, as examples. The interconnect structure 186 provides horizontal electrical connections for the packaging device 110.

At least a top portion of the interconnect structure 186 includes the substrate 112, the contact pads 114, the passivation layer 116, the polymer layer 118, the PPI lines 102, the transition elements 106, and the PPI pads 104 described herein. These elements are not labelled in FIG. 23; see FIG. 3 and FIG. 24. In FIG. 23, corner regions 168a and 168b of the array 165 shown in FIG. 19 are illustrated, for example.

To form the packaging device 110 shown in FIG. 23, one or more carriers may be used. For example, a carrier, not shown, may be provided. The carrier may comprise a carrier wafer or strip, as examples. The carrier may comprise glass, a semiconductor material, or other materials. The adhesive 172 is applied to the carrier, and the overlying layers are formed over the adhesive 172. Or, the carrier may be provided, the upper interconnect structure 186 may be formed over the carrier, and the underlying material layers may be sequentially formed over the interconnect structure 186 in a reverse order.

Figure 25:
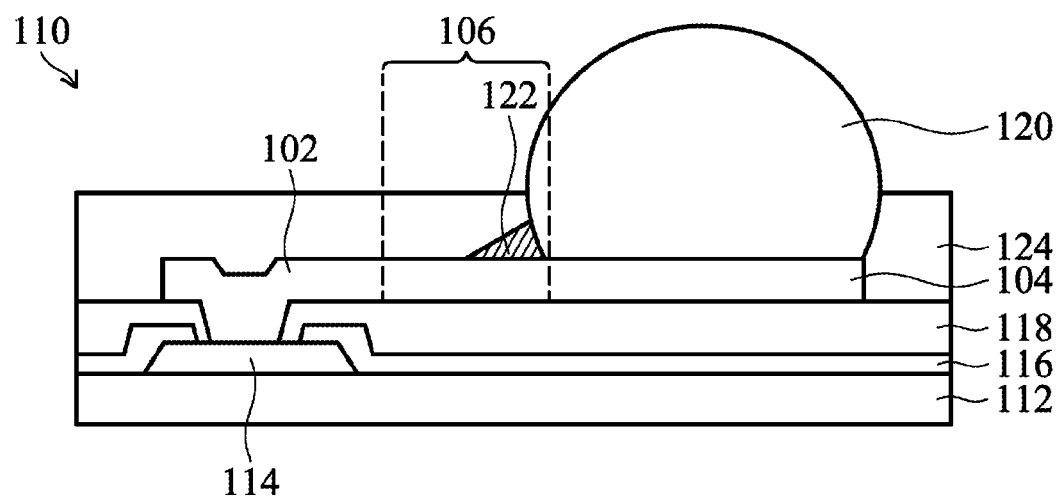

A plurality of connectors 120 is then formed over the interconnect structure 186 that are coupled to each of the PPI pads 104, as described for FIG. 4 herein and also shown in FIG. 25. The connectors 120 may be formed using a ball drop process or other process. A test may be performed on the connectors 120 after the ball drop process in some embodiments. The packaging device 110 may then be used to package a semiconductor device such as an integrated circuit die, a plurality of integrated circuit dies, or partially packaged dies, as examples, using the contacts pads on the lower side of the packaging device 110 that are coupled to the through-vias 178 shown in FIG. 23.

Figure 24:
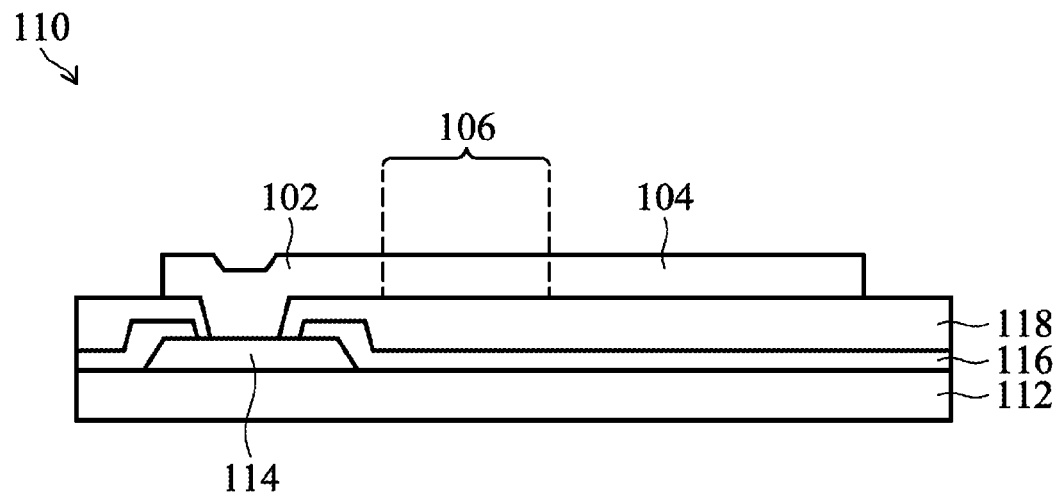
FIGS. 24 and 25 are cross-sectional views of a packaging device in accordance with some embodiments at various stages of manufacturing.

FIGS. 24 and 25 are cross-sectional views of a packaging device 110 in accordance with some embodiments at various stages of manufacturing. Similar views of packaging devices are shown in FIGS. 24 and 25 that were shown in FIGS. 3 and 4, for example. The transition regions 108 do not include hollow regions 108 in the embodiments shown in FIGS. 24 and 25. In other embodiments, the transition regions 108 shown and described for the embodiments illustrated in FIGS. 14 through 25 may also include hollow regions 108 described herein with reference to FIGS. 1 through 13. The hollow regions 108 may comprise a shape such as a circle, an oval, a triangle, a triangle with a curved side or a curved corner, a rectangle, a rectangle with a curved side or a curved corner, a square, a square with a curved side or a curved corner, a polygon, a polygon with a curved side or a curved corner, a fragment of an annulus, or a combination thereof, as examples.

Some embodiments of the present disclosure include packaging devices 110. Some embodiments include methods of manufacturing the packaging devices 110 described herein.

For example, referring to FIG. 24, in accordance with some embodiments, a method of manufacturing a packaging device 110 includes forming a contact pad 114 over a substrate 112, and forming a passivation layer 116 over the substrate 112 and a first portion of the contact pad 114 (e.g., the edge regions of the contact pads 114) yet leaving a second portion of the contact pad 114 exposed (e.g., the central regions of the contact pads 114). The method includes forming a PPI line 102, a transition element 106, and a PPI pad 104 over the passivation layer 116, wherein the PPI line 102 is coupled to the second portion of the contact pad 114, wherein the transition element 106 is coupled to the PPI line 102 and comprises a substantially triangular shape, wherein an angle $\alpha_2$ of two sides 162a and 162b (see FIG. 16) of the transition element 106 comprises about 70 degrees proximate the PPI line 102, and wherein the PPI pad 104 is coupled to the transition element 106. Forming the PPI line 102, the transition element 106, and the PPI pad 104 comprises forming a transition element 106 wherein each of the two sides 162a and 162b of the transition element 106 is non-tangential to the PPI pad 104.

In some embodiments, forming the contact pad 114 comprises forming a first contact pad 114, and forming the PPI line 102, the transition element 106, and the PPI pad 104 comprises forming a first PPI line 102, a first transition element 106, and a first PPI pad 104. A method of manufacturing a packaging device 110 further comprises forming a second contact pad 114' over the substrate 112 (the formation methods are similar to the methods shown in FIG. 1; see also FIG. 18), forming the passivation layer 116 over a first portion of the second contact pad 114' yet leaving a second portion of the second contact pad 114' exposed, and forming a second PPI line 102', a second transition element 106', and a second PPI pad 104' over the passivation layer 116. The second PPI line 102' is coupled to the second portion of the second contact pad 114' and the second transition element 106' is coupled to the second PPI line 102'. The second PPI pad 104' is coupled to the second transition element 106'. An angle $\alpha_{2'}$ of two sides 162a and 162b of the second transition element 106' comprises about 90 degrees proximate the second PPI line 102'. Forming the second PPI line 102', the second transition element 106', and the second PPI pad 104' comprises forming a second transition element 106' wherein each of the two sides of the second transition element 106' is substantially tangential to the second PPI pad 104'.

Advantages of some embodiments of the disclosure include providing packaging devices 110 that include a transition element 106 in the post passivation interconnect that improves reliability by preventing or reducing solder wetting on the PPI line 102. Post passivation interconnect schemes that are implementable as RDLs and other types of interconnect routing in packaging devices are disclosed that include a PPI line 102, a transition element 106 including a hollow region 108 in some embodiments coupled to the PPI line 102, and a PPI pad 104 coupled to the transition element 106. The PPI schemes have an optimized geometry to reduce a risk of PPI line 102 cracking. The transition element 106 comprises a transition zone between the PPI line 102 and PPI pad 104 that is a sacrificial region or buffer region upon which solder wetting may occur, preventing a wetting region from forming on the PPI line 102.

The transition element 106 provides a wetting region for the eutectic material of a conductive material 120 that is later formed on the PPI pad 104. Some embodiments include an extension element 140 that also includes hollow regions 108'/108' and provides an additional wetting region. The hollow regions 108, 108', and 108'' comprise a stopping point for excess eutectic material and flux, which prevents or reduces necking of the eutectic material onto the PPI lines 102. The extension element 140/140' further prevents or reduces the formation of wetting regions of eutectic material on the PPI lines 102. In some embodiments, solder ball wetting is minimized to only the PPI pad 104.

The PPI designs improve package reliability and prevent PPI line 102 cracking. The PPI designs do not require an under-ball metallization (UBM) structure and thus provide a cost savings. A process window for mounting the conductive material 120 is improved. Cracks in the PPI line 102 are prevented or reduced after the application of the molding compound 124, which is applied in some applications using a molding tool clamp which applies a force to the top of the package, for example. The transition element 106 and extension element 140/140' reduce stress on the end of the PPI line 102 trace, by controlling the conductive material 120 wetting to avoid extending the wetting region to the PPI line 102. No additional lithography masks or processes are required to implement the transition element 106 and extension element 140/140' into the packaging device interconnect routing. Furthermore, the packaging device 110 structures and designs described herein are easily implementable in manufacturing and packaging process flows.

Some advantages of some of the embodiments shown in FIGS. 14 through 25 include providing enhanced RDL mechanical strength and reinforced reliability of the packaging device, by avoiding or preventing cracks at the necks of the PPI pads. Contact pads in weak locations such as corners, corner regions, and edge regions have a longer tear length, to avoid cracks proximate the PPI pads. The improved reliability provided by the non-tangential transition elements having the about 70 degree angles proximate the PPI lines results in increased yield and longer lifetime of packaged devices. A reliability window is enhanced utilizing the non-tangential transition elements. Furthermore, no additional material layers or photolithography process are required to implement the non-tangential transition elements.

In accordance with some embodiments of the present disclosure, a packaging device includes a contact pad disposed over a substrate, and a passivation layer disposed over the substrate and a first portion of the contact pad, wherein a second portion of the contact pad is exposed. A PPI line is disposed over the passivation layer coupled to the second portion of the contact pad, and a PPI pad is disposed over the passivation layer. A transition element is disposed over the passivation layer coupled between the PPI line and the PPI pad, wherein the transition element comprises a hollow region.

In accordance with other embodiments, a packaging device includes a substrate, a contact pad disposed over the substrate, and a passivation layer disposed over the substrate and a first portion of the contact pad, wherein a second portion of the contact pad is exposed. A PPI line is disposed over the passivation layer coupled to the second portion of the contact pad, and a PPI pad is disposed over the passivation layer. A transition element is disposed over the passivation layer coupled between the PPI line and the PPI pad, the transition element comprising a hollow region. A conductive material is disposed over the PPI pad.

In accordance with other embodiments, a method of manufacturing a packaging device includes forming a contact pad over a substrate, and forming a passivation layer over the substrate and a first portion of the contact pad yet leaving a second portion of the contact pad exposed. A PPI line, transition element, and PPI pad are formed over the passivation layer. The PPI line is coupled to the second portion of the contact pad. The transition element is coupled to the PPI line and comprises a hollow region. The PPI pad is coupled to the transition element.

In accordance with some embodiments, a packaging device includes a contact pad disposed over a substrate, and a passivation layer disposed over the substrate and a first portion of the contact pad. A PPI line is disposed over the passivation layer and is coupled to a second portion of the contact pad. A PPI pad is disposed over the passivation layer, and a transition element is disposed over the passivation layer and is coupled between the PPI line and the PPI pad. The transition element comprises a first side and a second side coupled to the first side. The first side and the second side of the transition element are non-tangential to the PPI pad.

In accordance with other embodiments, a packaging device includes a substrate, and a plurality of contact pads disposed over the substrate. A passivation layer is disposed over the substrate and a first portion each of the plurality of contact pads. A PPI line is disposed over the passivation layer and is coupled to a second portion of each of the plurality of contact pads. A PPI pad is disposed over the passivation layer and is coupled to each of the PPI lines. The PPI pads are arranged in an array. A transition element is disposed over the passivation layer and is coupled between each of the PPI lines and each of the PPI pads in corners of the array. Each of the transition elements comprises a first side and a second side coupled to the first side. The first sides and the second sides of the transition elements are non-tangential to the PPI pads.

In accordance with other embodiments, a method of manufacturing a packaging device includes forming a contact pad over a substrate, and forming a passivation layer over the substrate and a first portion of the contact pad yet leaving a second portion of the contact pad exposed. The method includes forming a PPI line, a transition element, and a PPI pad over the passivation layer. The PPI line is coupled to the second portion of the contact pad. The transition element is coupled to the PPI line and comprises a substantially triangular shape. An angle of two sides of the transition element comprises about 70 degrees proximate the PPI line. The PPI pad is coupled to the transition element.

One general aspect includes a method of manufacturing a packaging device, the method including: forming a plurality of contact pads over a substrate; forming a passivation layer over the substrate and the plurality of contact pads; etching an opening in the passivation layer to expose a first portion of each of the plurality of contact pads, where after the etching, a second portion of each of the plurality of contact pads remains covered by the passivation layer; forming a plurality of post passivation interconnect (PPI) lines over the passivation layer, a respective one of the plurality of PPI lines being coupled to the first portion of a respective one of the plurality of contact pads; forming a plurality of a PPI pads over the passivation layer, a respective one of the plurality of PPI pads being coupled to a respective one of the plurality of PPI lines, the plurality of PPI pads being arranged in an array; and forming a plurality of transition elements disposed over the passivation layer where each of the transition elements includes a first side and a second side coupled to the first side, where the first sides and the second sides of the transition elements are non-tangential to the plurality of PPI pads, and where respective ones of the plurality of transition elements are coupled between each of the plurality of PPI lines and each of the plurality of PPI pads in corner regions of the array.

One general aspect of embodiments disclosed herein includes a method of manufacturing a packaging device, the method including: forming a of contact pad over a substrate; depositing a passivation layer over the substrate and the of contact pad; patterning the passivation layer to expose a first portion of the contact pad, where after the patterning, a second portion of the contact pad remains covered by the passivation layer; forming a post passivation interconnect (PPI) line over the passivation layer, the PPI line being coupled to the first portion of the contact pad; forming a PPI pad over the passivation layer, the PPI pad being coupled to the PPI line; and forming a transition element disposed over the passivation layer where the transition element includes a first side and a second side coupled to the first side, where the first side and the second side of the transition element are non-tangential to the PPI pad, and where the transition element is coupled between the PPI line and the PPI pad in a corner region of the substrate.

One general aspect of embodiments disclosed herein includes a device, including: a contact pad over a substrate; a passivation layer over the substrate and a first portion of the contact pad, the passivation layer leaving a second portion of the contact pad exposed; and a post passivation interconnect (PPI) line, a transition element, and a PPI pad over the passivation layer, the PPI line being coupled to the second portion of the contact pad, the transition element being coupled to the PPI line and including a substantially triangular shape, where an angle of two sides of the transition element includes about 70 degrees proximate the PPI line, and where the PPI pad is coupled to the transition element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A method of manufacturing a packaging device, the method comprising:
    forming a plurality of contact pads over a substrate;
    forming a passivation layer over the substrate and the plurality of contact pads;
    etching an opening in the passivation layer to expose a first portion of each of the plurality of contact pads, wherein after the etching, a second portion of each of the plurality of contact pads remains covered by the passivation layer;
    forming a plurality of post passivation interconnect (PPI) lines over the passivation layer, a respective one of the plurality of PPI lines being coupled to the first portion of a respective one of the plurality of contact pads;
    forming a plurality of a PPI pads over the passivation layer, a respective one of the plurality of PPI pads being coupled to a respective one of the plurality of PPI lines, the plurality of PPI pads being arranged in an array; and
    forming a plurality of transition elements disposed over the passivation layer wherein each of the transition elements comprises a first side and a second side coupled to the first side, wherein the first sides and the second sides of the transition elements are non-tangential to the plurality of PPI pads, and wherein respective ones of the plurality of transition elements are coupled between each of the plurality of PPI lines and each of the plurality of PPI pads in corner regions of the array.

2. The method of claim 1, wherein each of the transition elements further comprises a third side that is curved.

3. The method of claim 2, wherein the third side is aligned with outer edges of respective ones of the plurality of PPI pads.

4. The method of claim 1, wherein forming a plurality of transition elements includes blanket coating a conductive material over the polymer layer and photolithographically patterning the blanket deposited conductive material.

5. The method of claim 1, wherein forming a plurality of transition elements includes:
    forming a seed layer on the polymer layer;
    forming a photoresist layer on the seed later;
    patterning the photoresist layer with a pattern corresponding to the plurality PPI lines, the plurality of a PPI pads and the plurality of transition elements; and
    plating conductive material onto the seed layer through the patterned photoresist layer.

6. The method of claim 1, wherein respective ones of the plurality of transition regions further comprise hollow regions within them.

7. The method of claim 1, further comprising forming a plurality of connectors on respective ones of the plurality of PPI pads.

8. The method of claim 7, wherein the plurality of connectors comprises solder and wherein the plurality of transition regions prevent or reduce a wetting region forming over the plurality of PPI lines.

9. A method of manufacturing a packaging device, the method comprising:
    forming a of contact pad over a substrate;
    depositing a passivation layer over the substrate and the of contact pad;
    patterning the passivation layer to expose a first portion of the contact pad, wherein after the patterning, a second portion of the contact pad remains covered by the passivation layer;
    forming a post passivation interconnect (PPI) line over the passivation layer, the PPI line being coupled to the first portion of the contact pad;
    forming a PPI pad over the passivation layer, the PPI pad being coupled to the PPI line; and
    forming a transition element disposed over the passivation layer wherein the transition element comprises a first side and a second side coupled to the first side, wherein the first side and the second side of the transition element are non-tangential to the PPI pad, and wherein the transition element is coupled between the PPI line and the PPI pad in a corner region of the substrate.

10. The method of claim 9, wherein the transition element is configured to prevent or reduce wetting of the PPI line when a solder connector is connected to the PPI pad.

11. The method of claim 9, further comprising:
    attaching a connector to the PPI pad; and
    reflowing the connector.

12. The method of claim 11, wherein reflowing the connector forms a wetting region on the transition element.

13. The method of claim 9, wherein reflowing the connector causes material to flow into a hollow region formed in the transition element.

14. The method of claim 9, wherein the PPI, the PPI pad and the transition element are formed simultaneously.

15. The method of claim 11, further comprising encapsulating the PPI line and transition element and a portion of the connector in a molding compound.

16. A device, comprising:
    a contact pad over a substrate;
    a passivation layer over the substrate and a first portion of the contact pad, the passivation layer leaving a second portion of the contact pad exposed; and
    a post passivation interconnect (PPI) line, a transition element, and a PPI pad over the passivation layer, the PPI line being coupled to the second portion of the contact pad, the transition element being coupled to the PPI line and comprising a substantially triangular shape, wherein an angle of two sides of the transition element comprises about 70 degrees proximate the PPI line, and wherein the PPI pad is coupled to the transition element.

17. The device of claim 16, wherein the transition element further includes a curved outer edge substantially aligned with an outer edge of the PPI pad.

18. The device of claim 16, wherein the transition element further includes a hollow region.

19. The device of claim 16, further including a solder connector on the PPI pad, wherein the transition element is configured to reduce or eliminate wetting of the PPI line.

20. The device of claim 16, wherein the contact pad is located at a corner of the substrate.

* * * * *